(12) United States Patent
Jia

(10) Patent No.: US 11,532,870 B2
(45) Date of Patent: Dec. 20, 2022

(54) HOUSING ASSEMBLY AND ELECTRONIC DEVICES

(71) Applicant: GUANGDONG OPPO MOBILE TELECOMMUNICATIONS CORP., LTD., Guangdong (CN)

(72) Inventor: Yuhu Jia, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 180 days.

(21) Appl. No.: 16/913,713

(22) Filed: Jun. 26, 2020

(65) Prior Publication Data

US 2020/0411954 A1 Dec. 31, 2020

(30) Foreign Application Priority Data

Jun. 30, 2019 (CN) .......................... 201910588903.9
Jan. 17, 2020 (CN) .......................... 202010062257.5
Jan. 17, 2020 (CN) .......................... 202020124032.3

(51) Int. Cl.
*H01Q 1/24* (2006.01)
*H01Q 1/42* (2006.01)
(Continued)

(52) U.S. Cl.
CPC ............... *H01Q 1/243* (2013.01); *H01Q 1/42* (2013.01); *H01Q 21/065* (2013.01);
(Continued)

(58) Field of Classification Search
CPC ........... H01Q 1/38; H01Q 1/243; H01Q 1/22; H01Q 1/50; H01Q 1/48; H01Q 9/0414;
(Continued)

(56) References Cited

U.S. PATENT DOCUMENTS

2014/0118217 A1 5/2014 Cannon et al.
2018/0026341 A1 1/2018 Mow et al.
2019/0165473 A1* 5/2019 Yun .................... H01Q 21/0025

FOREIGN PATENT DOCUMENTS

CN 102931454 A 2/2013
CN 103367903 A 10/2013
(Continued)

OTHER PUBLICATIONS

3rd Generation Partnership Project; Technical Specification Group Radio Access Network; NR; User Equipment (UE) radio transmission and reception; Part 2: Range 2 Standalone (Release 16); "3GPP TS 38.101-2" V16.4.0 (Jun. 2020).
(Continued)

*Primary Examiner* — Graham P Smith
(74) *Attorney, Agent, or Firm* — Young Basile Hanlon & MacFarlane, P.C.

(57) ABSTRACT

A housing assembly is provided according to the present disclosure. The housing assembly includes a dielectric substrate and a radio-wave transparent structure. The dielectric substrate has a first transmittance for a radio frequency signal in a preset frequency band. The radio-wave transparent structure is disposed on the dielectric substrate and at least partially covers the dielectric substrate. A region of the housing assembly corresponding to the radio-wave transparent structure has a second transmittance for the radio frequency signal in the preset frequency band, and the second transmittance is larger than the first transmittance. The housing assembly can be applied to an electronic device having an antenna module.

20 Claims, 29 Drawing Sheets

(51) Int. Cl.
*H01Q 21/06* (2006.01)
*H04B 1/00* (2006.01)
*H05K 1/09* (2006.01)
*H05K 1/18* (2006.01)
*H05K 5/00* (2006.01)
*H05K 5/02* (2006.01)

(52) U.S. Cl.
CPC ............ *H04B 1/005* (2013.01); *H05K 1/09* (2013.01); *H05K 1/181* (2013.01); *H05K 5/0086* (2013.01); *H05K 5/0247* (2013.01)

(58) Field of Classification Search
CPC .. H01Q 1/42; H01Q 1/24; H01Q 1/36; H01Q 21/08; H01Q 5/307; H01Q 21/00; H01Q 21/065; H01Q 5/10; H01Q 5/378; H01Q 9/0457; H01Q 9/0464; H01Q 15/0026; H01Q 1/422; H01Q 5/20; H01Q 13/10; H01Q 1/2283; H01Q 9/045; H01Q 21/24; H01Q 5/30; H01Q 9/0407; H01Q 1/2266; H01Q 1/52; H01Q 1/523; H01Q 15/08; H01Q 1/241; H01Q 3/30; H01Q 9/0435; H01Q 19/06; H01Q 5/28; H01Q 21/06; H01Q 1/242; H01Q 1/405; H01Q 1/425; H01Q 9/04; H01Q 1/246; H01Q 21/0093; H01Q 3/04; H01Q 5/50; H01Q 3/44; H01Q 5/328; H01Q 1/2258; H01Q 1/521; H01Q 15/24; H01Q 21/0031; H01Q 21/0081; H01Q 21/28; H01Q 25/04; H01Q 3/46; H01Q 5/371; H01Q 1/00; H01Q 1/27; H01Q 1/32; H01Q 1/44; H01Q 15/0013; H01Q 15/0093; H01Q 21/0006; H01Q 21/20; H01Q 3/26; H01Q 5/314; H01Q 5/335; H01Q 5/35; H01Q 5/42; H01Q 1/2225; H01Q 19/104; H01Q 21/0075; H01Q 1/244; H01Q 1/273; H01Q 17/00; H01Q 19/062; H01Q 21/29; H01Q 5/321; H01Q 5/385; H01Q 23/00; H01Q 21/30; H01Q 7/00; H01Q 3/247; H01Q 9/42; H01Q 1/12; H01Q 15/02; H01Q 3/24; H01Q 13/18; H01Q 1/1235; H01Q 13/106; H01Q 3/02; H01Q 1/02; H01Q 1/10; H01Q 1/526; H01Q 9/0442; H01Q 1/40; H01Q 1/1207; H01Q 1/364; H01Q 13/00; H01Q 5/364; H01Q 9/40; H01Q 1/2291; H01Q 3/00; H01Q 3/08; H01Q 3/40; H01Q 5/357; H01Q 1/1221; H01Q 1/20; H01Q 1/28; H01Q 1/528; H01Q 15/14; H01Q 7/08; H01Q 9/0471; H01Q 9/065; H01Q 9/26; H01Q 9/32; H01Q 1/084; H01Q 1/247; H01Q 13/103; H01Q 15/10; H01Q 19/10; H01Q 25/00; H01Q 3/2617; H01Q 3/267; H01Q 3/34; H01Q 3/36; H01Q 5/00; H01Q 5/392; H01Q 5/40; H01Q 5/45; H01Q 1/08; H01Q 1/125; H01Q 1/16; H01Q 1/2208; H01Q 1/2216; H01Q 1/245; H01Q 1/26; H01Q 1/525; H01Q 13/08; H01Q 15/0006; H01Q 15/04; H01Q 21/061; H01Q 21/10; H01Q 21/245; H01Q 21/293; H01Q 3/005; H01Q 3/22; H01Q 3/28; H01Q 7/06; H01Q 9/00; H01Q 9/0485; H04M 1/0264; H04M 1/02; H04M 1/0266; H04M 1/026; H04M 1/0268; H04M 1/022; H04M 1/18; H04M 2250/20; H04M 1/725; H04M 1/0214; H04M 1/0225; H04M 1/0235; H04M 1/0237; H04M 1/0243; H04M 1/035; H04M 1/03; H04M 1/0283; H04M 1/0277; H04M 1/0272; H04M 1/185; H04M 1/22; H04M 2250/22; H04M 1/0249; H04M 1/0254; H04M 1/2757; H04M 1/60; H04M 1/67; H04M 1/72454; H04M 2250/12; H04M 1/72448; H04M 1/0202; H04M 1/72403; H04M 1/0216; H04M 19/00; H04M 2250/52; H04M 1/72463; H04M 1/72484; H04M 1/0274; H04M 1/0262; H04M 1/24; H04M 1/72457; H04M 1/72412; H04M 1/72442; H04M 1/72439; H04M 1/23; H04M 1/7243; H04M 1/72469; H04M 1/72451; H04M 2250/16; H04M 1/236; H04M 19/04; H04M 1/6066; H04M 2250/74; H04M 1/72406; H04M 1/72409; H04M 19/08; H04M 1/04; H04M 1/72427; H04M 1/0279; H04M 1/72466; H04M 1/73; H04M 1/724; H04M 1/6016; H04M 2250/02; H04M 1/19; H04M 1/72433; H04M 9/08; H04M 1/0206; H04M 1/0252; H04M 1/0256; H04M 1/72436; H04M 15/66; H04M 2201/38; H04M 2250/64; H04M 1/021; H04M 1/6058; H04M 1/673; H04M 1/72472; H04M 1/0247; H04M 1/26; H04M 1/605; H04M 2203/6054; H04M 9/082; H04M 1/72415; H04M 19/047; H04M 2201/40; H04M 1/0208; H04M 1/21; H04M 1/6008; H04M 1/656; H04M 19/045; H04M 2250/10; H04M 1/0227; H04M 1/0281; H04M 1/2745; H04M 19/042; H04M 2201/405; H04M 2250/54; H04M 1/0233; H04M 1/27457; H04M 1/57; H04M 19/048; H04M 2201/42; H04M 2250/06; H04M 1/0245; H04M 1/05; H04M 1/17; H04M 1/233; H04M 1/2746; H04M 1/665; H04M 1/72418; H04M 15/8044; H04M 2201/14; H04M 2201/34; H04M 2250/60; H04M 1/0241; H04M 1/0258; H04M 1/0287; H04M 1/0295; H04M 1/27453; H04M 1/2748; H04M 1/6505; H04M 1/663; H04M 1/72502; H04M 1/72505; H04M 1/74; H04M 11/066; H04M 15/61; H04M 15/62; H04M 19/041; H04M 19/044; H04M 2201/20; H04M 2242/40; H04M 2250/04; H04M 2250/58; H04M 2250/68; H04M 3/42042; H04M 3/42374; H04M 3/436; H04M 1/0218; H04M 1/12; H04M 1/20; H04M 1/2471; H04M 1/27; H04M 1/271; H04M 1/27475; H04M 1/275; H04M 1/6041; H04M 1/6091; H04M 1/62; H04M 1/65; H04M 1/72421; H04M 1/72424; H04M 1/72511; H04M 1/82; H04M 15/41; H04M 15/47; H04M 15/8228; H04M 17/10; H04M 17/103; H04M 2201/08; H04M 2201/39; H04M 2242/14; H04M 2250/14; H04M 2250/56; H04M 2250/66; H04M 3/2227; H04M 3/2236; H04M 3/28; H04M 3/42187; H04M 3/42195; H04M 3/42246; H04M 3/4228; H04M 3/42348; H04M 3/5183; H04M 3/5191;

H04M 3/54; H04M 7/0024; H04M 7/0072; H04M 7/1205; H04B 1/005; H05K 1/09; H05K 1/181; H05K 5/0086; H05K 5/0247
See application file for complete search history.

(56) References Cited

FOREIGN PATENT DOCUMENTS

| CN | 103367912 A | | 10/2013 | | |
|---|---|---|---|---|---|
| CN | 104685578 A | | 6/2015 | | |
| CN | 105914462 A | * | 8/2016 | ............. | H01Q 1/422 |
| CN | 107946762 A | | 4/2018 | | |
| CN | 105914462 B | | 2/2019 | | |
| CN | 109642938 A | | 4/2019 | | |
| EP | 3490058 A1 | | 5/2019 | | |
| WO | 2014197328 A1 | | 12/2014 | | |

OTHER PUBLICATIONS

3rd Generation Partnership Project; Technical Specification Group Radio Access Network; Study on new radio access technology: Radio Frequency (RF) and co-existence aspects (Release 14); "3GPP TR 38.803" V14.2.0 (Sep. 2017).

ISR issued in corresponding international application No. PCT/CN2020/095944 dated Sep. 23, 2020.

EESR issued in corresponding European application No. 20178350.3 dated Nov. 20, 2020.

Indian Examination Report for IN Application 202014026921 dated Mar. 30, 2021. (5 pages).

* cited by examiner

HOUSING ASSEMBLY AND ELECTRONIC DEVICES

CROSS-REFERENCE TO RELATED APPLICATION(S)

This application claims priority to Chinese Patent Application Serial No. 201910588903.9, filed on Jun. 30, 2019, Chinese Patent Application Serial No. 202020124032.3, filed on Jan. 17, 2020, and Chinese Patent Application Serial No. 202010062257.5, filed on Jan. 17, 2020, the entire disclosures of which are hereby incorporated by reference.

TECHNICAL FIELD

This disclosure relates to the field of electronic devices, and in particular, to a housing assembly and electronic devices.

BACKGROUND

With the development of mobile communication technology, the traditional fourth generation (4G) mobile communication cannot meet user requirements. The fifth generation (5G) mobile communication is favored by users as the 5G mobile communication can provide a high communication speed. For example, a data transmission speed in the 5G mobile communication is hundreds of times higher than that in the 4G mobile communication. The 5G mobile communication is mainly implemented via millimeter wave signals. However, when a millimeter wave antenna is applied to an electronic device, the millimeter wave antenna is generally disposed within an accommodation space in the electronic device, while the electronic device has a relatively low transmittance for the millimeter wave signal, which cannot meet the requirements of antenna radiation performance. Alternatively, a screen of the electronic device has a relatively low transmittance for external millimeter wave signals to be received by the electronic device. Thus, the related art offers poor performance in 5G millimeter wave communications.

SUMMARY

A housing assembly and electronic devices are provided according to the present disclosure.

According to a first aspect, a housing assembly is provided according to the present disclosure. The housing assembly includes a dielectric substrate and a radio-wave transparent structure. The dielectric substrate has a first transmittance for a radio frequency signal in a preset frequency band. A radio-wave transparent structure is disposed on the dielectric substrate and at least partially covers the dielectric substrate. A region of the housing assembly corresponding to the radio-wave transparent structure has a second transmittance for the radio frequency signal in the preset frequency band, and the second transmittance is larger than the first transmittance.

According to a second aspect, an electronic device is further provided. The electronic device includes an antenna module and a housing assembly. The antenna module is configured to transmit and receive, within a preset direction range, a radio frequency signal in a preset frequency band. The housing assembly includes a dielectric substrate and a radio-wave transparent structure. The dielectric substrate has a first transmittance for the radio frequency signal in the preset frequency band. The radio-wave transparent structure is disposed on the dielectric substrate and at least partially covers the dielectric substrate, and the radio-wave transparent structure is at least partially within the preset direction range. A region of the housing assembly within the preset direction range has a second transmittance for the radio frequency signal in the preset frequency band, and the second transmittance is larger than the first transmittance.

According to a third aspect, an electronic device is provided. The electronic device includes a first antenna module, a dielectric substrate, and a first radio-wave transparent structure. The first antenna module is configured to transmit and receive, within a first preset direction range, a first radio frequency signal in a first frequency band. The dielectric substrate is spaced apart from the first antenna module. At least part of the dielectric substrate is within the first preset direction range, and the at least part of the dielectric substrate has a first transmittance for the first radio frequency signal in the first frequency band. The first radio-wave transparent structure is disposed on the dielectric substrate and at least partially within the first preset direction range. A region of the electronic device within the preset direction range has a second transmittance for the first radio frequency signal in the first frequency band, and the second transmittance is larger than the first transmittance.

BRIEF DESCRIPTION OF THE DRAWINGS

To describe technical solutions in the implementations of the present disclosure more clearly, the following briefly introduces the accompanying drawings required for describing the implementations. Apparently, the accompanying drawings in the following description merely illustrate some implementations of the present disclosure. Those of ordinary skill in the art may also obtain other obvious variations based on these accompanying drawings without creative efforts.

DETAILED DESCRIPTION

The technical solutions in the implementations of the present disclosure are clearly and completely described in the following with reference to the accompanying drawings in the implementations of the present disclosure. Apparently, the described implementations are merely a part of rather than all the implementations of the present disclosure. All other implementations obtained by those of ordinary skill in the art based on the implementations of the present disclosure without creative efforts are within the scope of the present disclosure.

Figure 1:
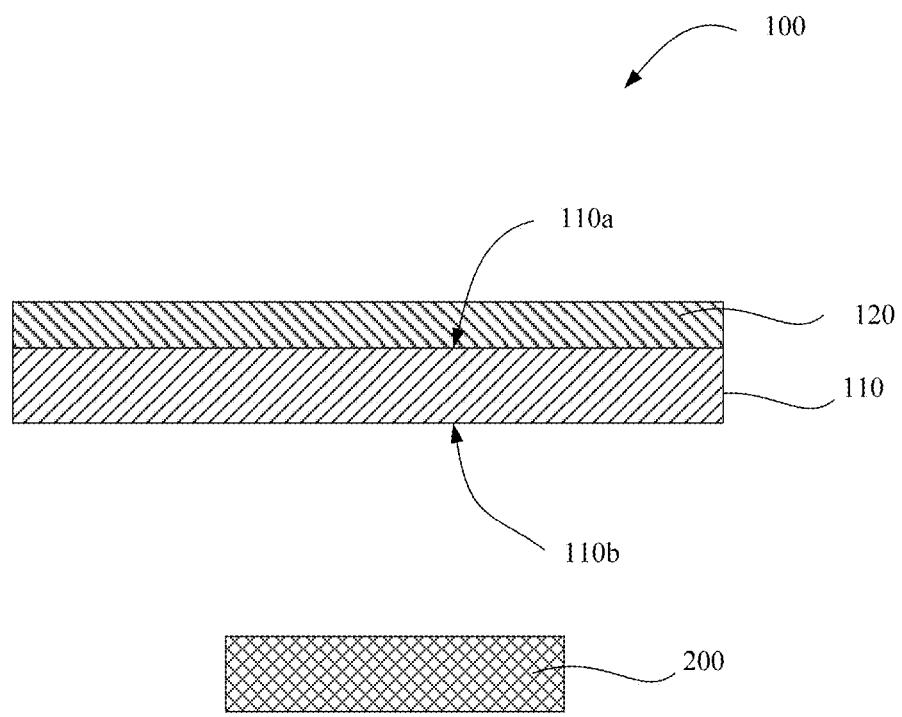
FIG. 1 is a schematic structural view of a housing assembly according to a first implementation of the present disclosure.

FIG. 1 is a schematic structural view of a housing assembly 100 according to a first implementation of the present disclosure. The housing assembly 100 includes a dielectric substrate 110 and a radio-wave transparent structure 120. The dielectric substrate 110 has a first transmittance for a radio frequency signal in a preset frequency band. The radio-wave transparent structure 120 is disposed on the dielectric substrate 110 and at least partially covers the dielectric substrate 110. A region of the housing assembly 100 corresponding to the radio-wave transparent structure 120 has a second transmittance for the radio frequency signal in the preset frequency band, and the second transmittance is larger than the first transmittance.

It is note that in the implementations of the present disclosure, the radio-wave transparent structure 120 is made of materials allowing radio waves to propagate through.

The housing assembly 100 according to the present disclosure is provided with the radio-wave transparent structure 120 disposed on the dielectric substrate 110. The radio-wave transparent structure 120 improves a transmittance of the housing assembly 100 for the radio frequency signal in the preset frequency band. When the housing assembly 100 is applied to an electronic device having an antenna module, the effect of the housing assembly 100 on performance of the antenna module can be reduced, thereby improving communication performance of the electronic device.

Referring to FIG. 1, an example that the radio-wave transparent structure 120 covers the overall dielectric substrate 110 is given for illustration. The radio frequency signal may be, but is not limited to, a radio frequency signal in a millimeter wave frequency band or a terahertz frequency band. Currently, in $5^{th}$ generation (5G) wireless communication systems, with accordance to the protocol of the 3GPP 38.101, frequency bands for 5G NR are mainly divided into two different frequency ranges: frequency range 1 (FR1) and frequency range 2 (FR2). The FR1 band has a frequency range of 450 MHz-6 GHz, and also knows as the "sub-6 GHz" band. The FR2 band has a frequency range of 24.25 GHz-52.6 GHz, and belongs to a millimeter wave (mmWave) band. 3GPP Release 15 specifies that the current 5G millimeter wave frequency bands include bands n257 (26.5 GHz-29.5 GHz), n258 (24.25 GHz-27.5 GHz), n261 (27.5 GHz-28.35 GHz), and n260 (37 GHz-40 GHz).

The radio-wave transparent structure 120 may have any one of characteristics such as single-frequency single-polarization, single-frequency dual-polarization, dual-frequency dual-polarization, dual-frequency single-polarization, wideband single-polarization, or wideband dual-polarization. The radio-wave transparent structure 120 has any one of a dual-frequency resonance response, a single-frequency resonance response, a wide-frequency resonance response, or a multi-frequency resonance response. The radio-wave transparent structure 120 may be made of a metal material or a non-metal conductive material.

In an implementation, the radio-wave transparent structure 120 is applied to the dielectric substrate 110 according to a following principle. The radio-wave transparent structure 120 on the dielectric substrate 110 is excited by the radio frequency signal in the preset frequency band, and the radio-wave transparent structure 120 generates a radio frequency signal in the same frequency band as the preset frequency band according to the radio frequency signal in the preset frequency band. The radio frequency signal generated by the radio-wave transparent structure 120 passes through the dielectric substrate 110 and radiates into free space. Since the radio-wave transparent structure 120 is excited and generates the radio frequency signal in the preset frequency band, multiple radio frequency signals in the preset frequency band can pass through the dielectric substrate 110 and radiate into the free space.

In the implementations of the present disclose, the preset frequency band may fall within at least one of the frequency range 1 (FR1) or the frequency range 2 (FR2). Alternatively, the preset frequency band includes at least one of the band n257, the band n258, the band n261, or the band n260. It is noted that, the preset frequency band may also be other frequency range.

In another implementation, the radio-wave transparent structure 120 is applied to the dielectric substrate 110 according to a following principle. The housing assembly 100 includes the radio-wave transparent structure 120 and the dielectric substrate 110. Thus, a dielectric constant of the housing assembly 100 can be equivalent to a dielectric constant of a preset material. The preset material has a relatively large transmittance for the radio frequency signal in the preset frequency band, and an equivalent wave impedance of the preset material is equal to or approximately equal to an equivalent wave impedance of the free space.

In the implementations according to the present disclosure, by providing the housing assembly 100 with the radio-wave transparent structure 120 disposed on the dielectric substrate 110, the transmittance of the housing assembly 100 for the radio frequency signal in the preset frequency band is improved via the radio-wave transparent structure 120. When the housing assembly 100 is applied to an electronic device 1, the effect of the housing assembly 100 on performance of an antenna module disposed in the housing assembly 100 can be reduced, thereby improving communication performance of the electronic device 1.

Further, the dielectric substrate 110 includes a first surface 110*a* and a second surface 110*b* opposite the first surface 110*a*. The radio-wave transparent structure 120 is disposed on the first surface 110*a*. In a case where the housing assembly 100 is applied to the electronic device 1, the electronic device 1 further includes an antenna module 200, and the first surface 110*a* is further away from the antenna module 200 than the second surface 110*b*.

Figure 2:
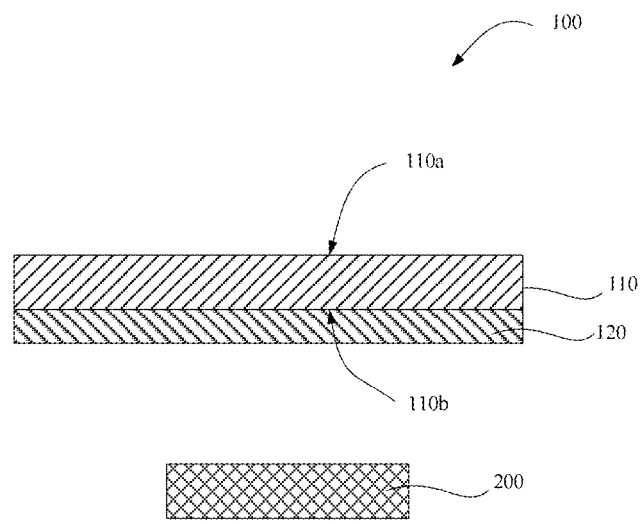
FIG. 2 is a schematic structural view of a housing assembly according to a second implementation of the present disclosure.

FIG. 2 is a schematic structural view of the housing assembly 100 according to a second implementation of the present disclosure. The housing assembly 100 includes the dielectric substrate 110 and the radio-wave transparent structure 120. The dielectric substrate 110 has the first transmittance for the radio frequency signal in the preset frequency band. The radio-wave transparent structure 120 is disposed on the dielectric substrate 110 and at least partially covers the dielectric substrate 110. A region of the housing assembly 100 corresponding to the radio-wave transparent structure 120 has the second transmittance for the radio frequency signal in the preset frequency band, and the second transmittance is larger than the first transmittance. Further, in this implementation, the radio-wave transparent structure 120 is disposed on the second surface 110*b*. In a case where the housing assembly 100 is applied to the electronic device 1, the electronic device 1 further includes the antenna module 200, and the first surface 110*a* is further away from the antenna module 200 than the second surface 110*b*.

Figure 3:
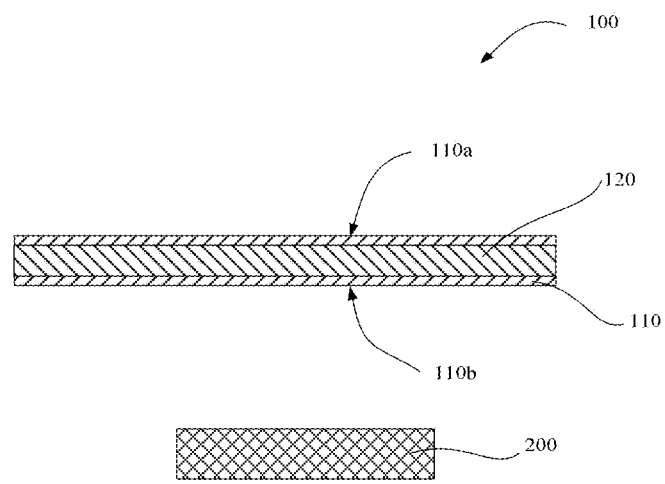
FIG. 3 is a schematic structural view of a housing assembly according to a third implementation of the present disclosure.

FIG. 3 is a schematic structural view of the housing assembly 100 according to a third implementation of the present disclosure. The housing assembly 100 includes the dielectric substrate 110 and the radio-wave transparent structure 120. The dielectric substrate 110 has the first transmittance for the radio frequency signal in the preset frequency band. The radio-wave transparent structure 120 is disposed on the dielectric substrate 110 and at least partially covers the dielectric substrate 110. The region of the housing assembly 100 corresponding to the radio-wave transparent structure 120 has the second transmittance for the radio frequency signal in the preset frequency band, and the second transmittance is larger than the first transmittance. In this implementation, the radio-wave transparent structure 120 is embedded in the dielectric substrate 110. In a case where the housing assembly 100 is applied to the electronic device 1, the electronic device 1 further includes the antenna module 200, and the first surface 110*a* is further away from the antenna module 200 than the second surface 110*b*.

Figure 4:
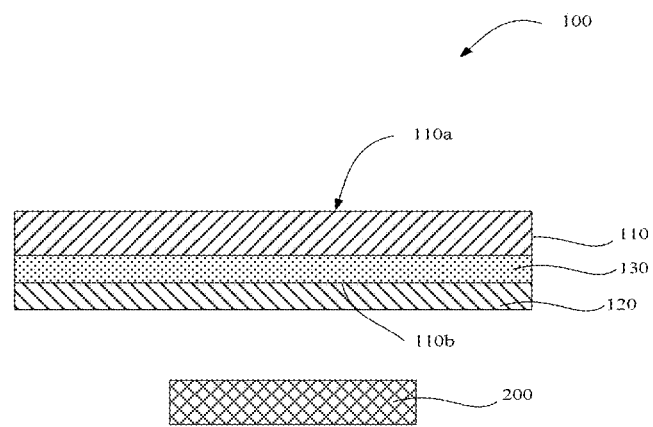
FIG. 4 is a schematic structural view of a housing assembly according to a fourth implementation of the present disclosure.

FIG. 4 is a schematic structural view of the housing assembly 100 according to a fourth implementation of the present disclosure. The housing assembly 100 includes the dielectric substrate 110 and the radio-wave transparent structure 120. The dielectric substrate 110 has the first transmittance for the radio frequency signal in the preset frequency band. The radio-wave transparent structure 120 is disposed on the dielectric substrate 110 and at least partially covers the dielectric substrate 110. The region of the housing assembly 100 corresponding to the radio-wave transparent structure 120 has the second transmittance for the radio frequency signal in the preset frequency band, and the second transmittance is larger than the first transmittance. Further, the radio-wave transparent structure 120 is attached to a carrier film 130, and the carrier film 130 is attached to the dielectric substrate 110. In a case where the radio-wave transparent structure 120 is attached to the carrier film 130, the carrier film 130 may be, but is not limited to, a plastic (for example, polyethylene terephthalate (PET)) film, a flexible circuit board, a printed circuit board, or the like. The PET film may be, but is not limited to, a color film, an explosion-proof film, or the like. Further, the dielectric substrate 110 includes the first surface 110*a* and the second surface 110*b* opposite the first surface 110*a*. The first surface 110*a* is further away from the antenna module 200 than the second surface 110*b*. Referring to FIG. 4, an example that the radio-wave transparent structure 120 is attached to the second surface 110*b* via the carrier film 130 is given for illustration. It is noted that, in other implementations, the radio-wave transparent structure 120 may be attached to the first surface 110*a* via the carrier film 130.

Figure 5:
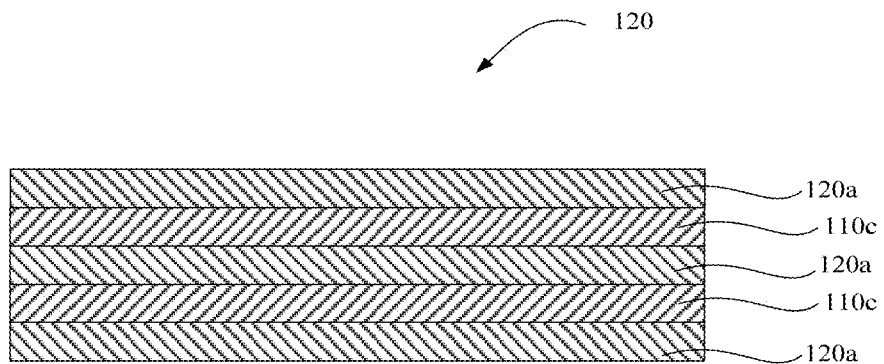
FIG. 5 is a schematic view of a radio-wave transparent structure according to the first implementation of the present disclosure.

FIG. 5 is a schematic view of the radio-wave transparent structure 120 according to the first implementation of the present disclosure. The radio-wave transparent structure 120 includes one or more radio-wave transparent layers 120*a*. When the radio-wave transparent structure 120 includes multiple radio-wave transparent layers 120*a*, the multiple radio-wave transparent layers 120*a* are stacked in a predetermined direction and spaced apart from each other. When the radio-wave transparent structure 120 includes the multiple radio-wave transparent layers 120*a*, a dielectric layer 110*c* is sandwiched between each two adjacent radio-wave transparent layers 120*a*, and all the dielectric layers 110*c* form the dielectric substrate 110. Referring to FIG. 5, an example that the radio-wave transparent structure 120 includes three radio-wave transparent layers 120*a* and two dielectric layers 110*c* is given for illustration. Further, the predetermined direction is parallel to a radiation direction of a main lobe of the radio frequency signal. The so-called main lobe refers to a beam with the maximum radiation intensity in the radio frequency signal.

Figure 6:
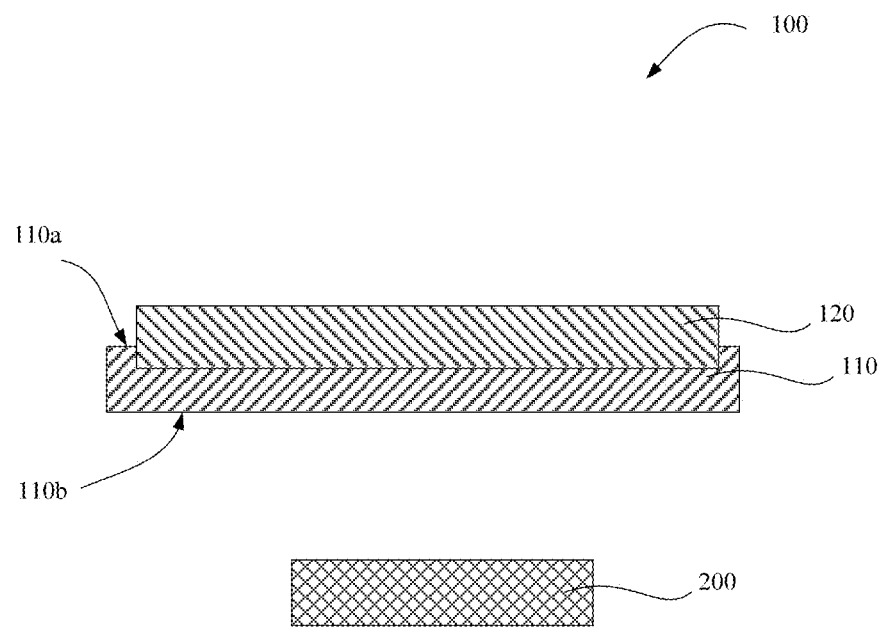
FIG. 6 is a schematic structural view of a housing assembly according to a fifth implementation of the present disclosure.

FIG. 6 is a schematic structural view of the housing assembly 100 according to a fifth implementation of the present disclosure. The dielectric substrate 110 includes the first surface 110*a* and the second surface 110*b* opposite the first surface 110*a*. A portion of the radio-wave transparent structure 120 is disposed on the first surface 110*a*, and the remaining portion of the radio-wave transparent structure 120 is embedded in the dielectric substrate 110. In a case where the housing assembly 100 is applied to the electronic device 1, the electronic device 1 further includes the antenna module 200, and the first surface 110*a* is further away from the antenna module 200 than the second surface 110*b*.

In combination with the housing assembly 100 provided in any of the foregoing implementations, the radio-wave transparent structure 120 is made of a metal material or a non-metal conductive material.

In combination with the housing assembly 100 provided in any of the foregoing implementations, the dielectric substrate 110 is made of plastic, glass, sapphire, or ceramic. Alternatively, the dielectric substrate 110 is made of a combination of at least two of plastic, glass, sapphire, or ceramic.

Figure 7:
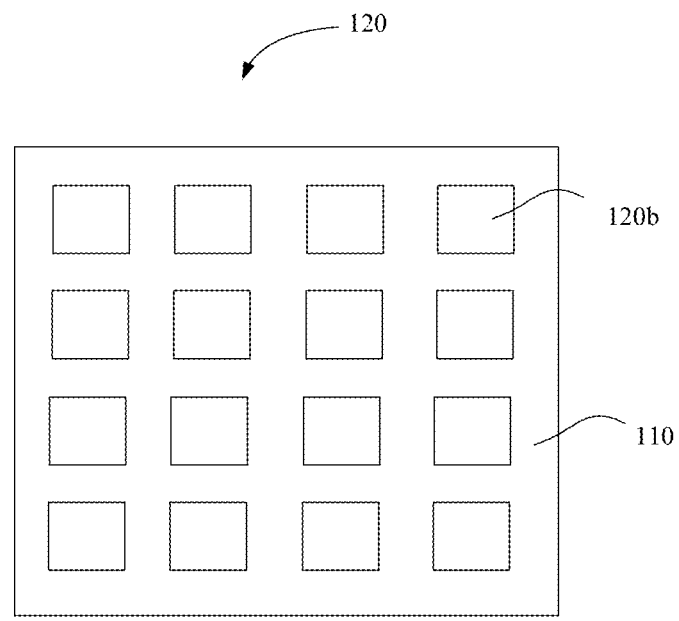
FIG. 7 is a schematic view of a radio-wave transparent structure according to the second implementation of the present disclosure.

FIG. 7 is a schematic view of the radio-wave transparent structure 120 according to the second implementation of the present disclosure. The radio-wave transparent structure 120 may be combined with the housing assembly 100 provided in any of the foregoing implementations. The radio-wave transparent structure 120 includes multiple resonance elements 120*b*, and the resonance elements 120*b* are periodically arranged. The resonance elements 120*b* may be conductive patches such as metal patches or non-metal conductive patches.

Figure 8:
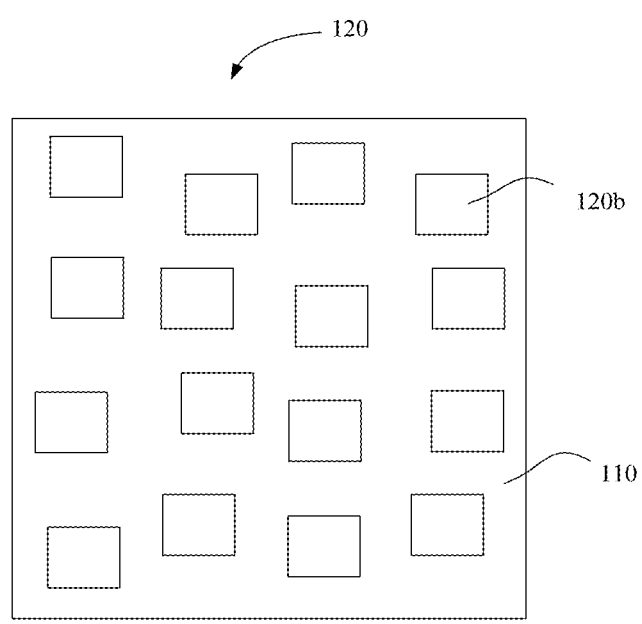
FIG. 8 is a schematic view of a radio-wave transparent structure according to the third implementation of the present disclosure.

FIG. 8 is a schematic view of the radio-wave transparent structure 120 according to the third implementation of the present disclosure. The radio-wave transparent structure 120 may be combined with the housing assembly 100 provided in any of the foregoing implementations. The radio-wave transparent structure 120 includes multiple resonance elements 120*b*, and the resonance elements 120*b* are non-periodically arranged.

Figure 9:
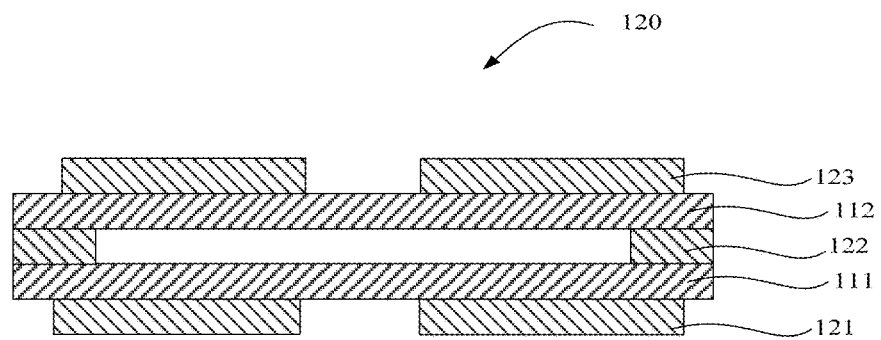
FIG. 9 is a schematic cross-sectional view of a radio-wave transparent structure according to the fourth implementation of the present disclosure.
Figure 10A:
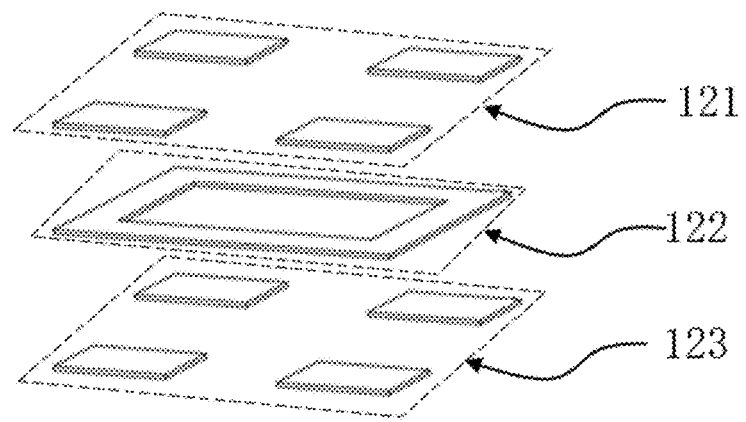
FIG. 10A is a schematic structural view of the radio-wave transparent structure according to the fourth implementation of the present disclosure.
Figure 10B:
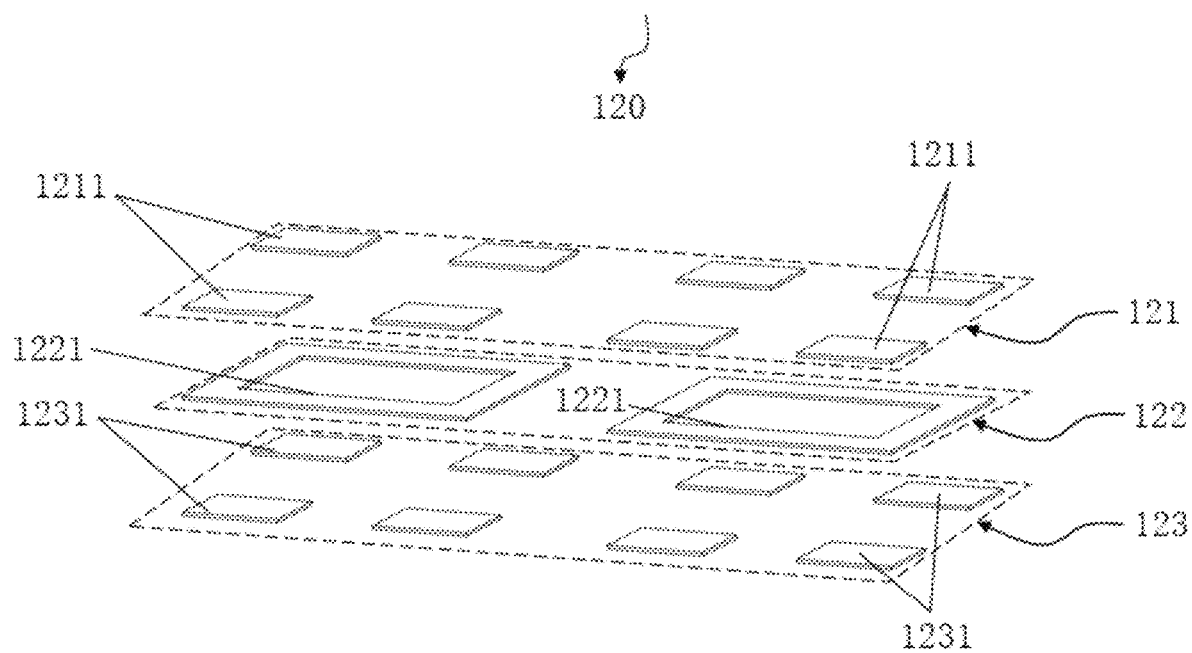
FIG. 10B is a schematic structural view of the radio-wave transparent structure according to an implementation of the present disclosure.
Figure 11:
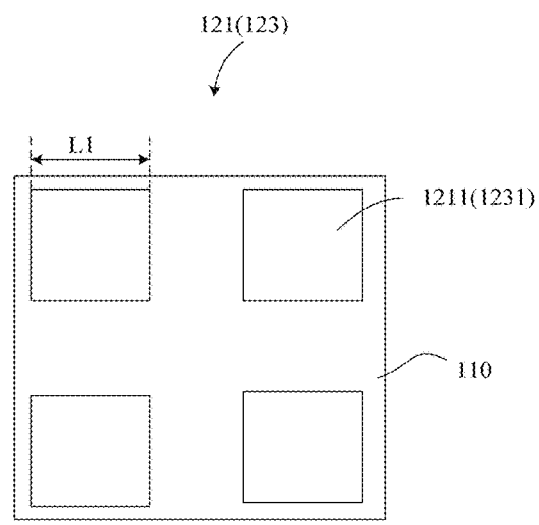
FIG. 11 is a schematic structural view of a first radio-wave transparent layer of the radio-wave transparent structure according to the fourth implementation of the present disclosure.
Figure 12:
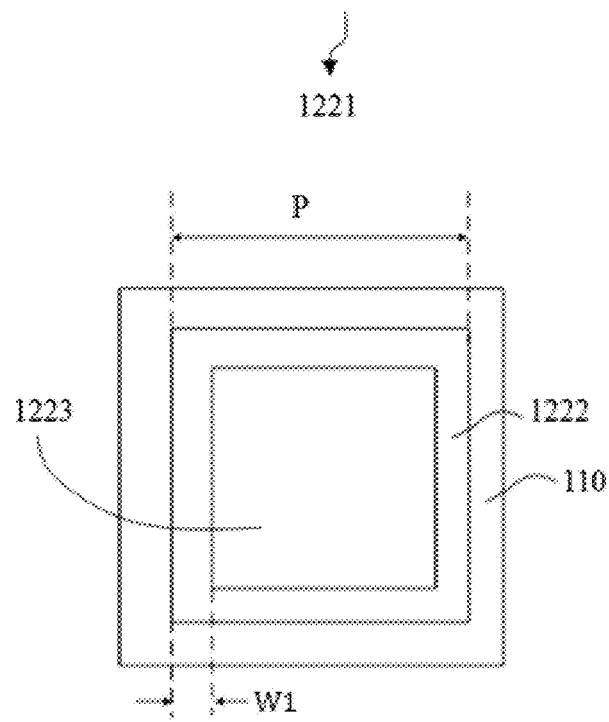
FIG. 12 is a schematic structural view of a second radio-wave transparent layer of the radio-wave transparent structure according to the fourth implementation of the present disclosure.

FIG. 9 is a schematic cross-sectional view of the radio-wave transparent structure 120 according to the fourth implementation of the present disclosure. FIG. 10A is a schematic structural view of the radio-wave transparent structure 120 according to the fourth implementation of the present disclosure. FIG. 10B is a schematic structural view of the radio-wave transparent structure 120 according to an implementation of the present disclosure. FIG. 11 is a schematic structural view of a first radio-wave transparent layer 121 of the radio-wave transparent structure 120 according to the fourth implementation of the present disclosure. FIG. 12 is a schematic structural view of the second radio-wave transparent layer 122 of the radio-wave transparent structure 120 according to the fourth implementation of the present disclosure. The radio-wave transparent structure 120 may be combined with the housing assembly 100 provided in any of the foregoing implementations. The radio-wave transparent structure 120 includes the first radio-wave transparent layer 121, the second radio-wave transparent layer 122, and a third radio-wave transparent layer 123 spaced apart from each other. The dielectric substrate 110 includes the first dielectric layer 111 and the second dielectric layer 112. The first radio-wave transparent layer 121, the first dielectric layer 111, the second radio-wave transparent layer 122, the second dielectric layer 112, and the third radio-wave transparent layer 123 are sequentially stacked together. As illustrated in FIG. 10B, the second radio-wave transparent layer 122 includes mesh-grid structures 1221 periodically arranged. In order to clearly illustrate relationships among the first radio-wave transparent layer 121, the second radio-wave transparent layer 122, and the third radio-wave transparent layer 123, the first dielectric layer 111 and the second radio-wave transparent layer 122 are omitted in FIGS. 10A and 10B. The first radio-wave transparent layer 121 includes multiple first patches 1211 arranged in an array. The third radio-wave transparent layer 123 includes multiple second patches 1231 arranged in an array. In an implementation, each of the mesh-grid structures 1221 of the second radio-wave transparent layer 122 includes a radio-wave transparent substrate 1222 and defines a through hole 1223 extending through the radio-wave transparent substrate 1222. For example, as an implementation, an orthographic projection of the first patch 1211 on the second radio-wave transparent layer 122 overlaps with an orthographic projection of the second patch 1231 on the second radio-wave transparent layer 122. The larger a size L1 of each of the first patches 1211 or each of the second patches 1231, the lower a center frequency of the preset frequency band and the narrower the preset frequency band. The smaller a width W1 of the mesh-grid structure 1221 of the second radio-wave transparent layer 122, the lower the center frequency of the preset frequency band and the wider the preset frequency band. The larger a period P of the radio-wave transparent structure 120, the higher the center frequency of the preset frequency band and the wider the preset frequency band. The thicker the radio-wave transparent structure 120, the lower the center frequency of the preset frequency band and the narrower the preset frequency band. The larger a dielectric constant of the dielectric substrate 110, the lower the center frequency of the preset frequency band and the narrower the preset frequency band. In this implementation, one mesh-grid structure 1221 is disposed corresponding to four first patches 1211 and four second patches 1231, and serves as one period of the radio-wave transparent structure 120.

It is noted that the radio-wave transparent substrate 1222 is made of materials allowing radio waves to pass through.

Referring to FIGS. 10A and 10B, as an implementation, an orthographic projection of the radio-wave transparent substrate 1222 of the second radio-wave transparent layer 122 on the dielectric substrate 110 at least partially overlaps with orthographic projections of the first patches 1211 of the first radio-wave transparent layer 121 on the dielectric substrate 110, and the orthographic projection of the radio-wave transparent substrate 1222 of the second radio-wave transparent layer 122 on the dielectric substrate 110 at least partially overlaps with orthographic projections of the second patches 1231 of the third radio-wave transparent layer 123 on the dielectric substrate 110.

Figure 13:
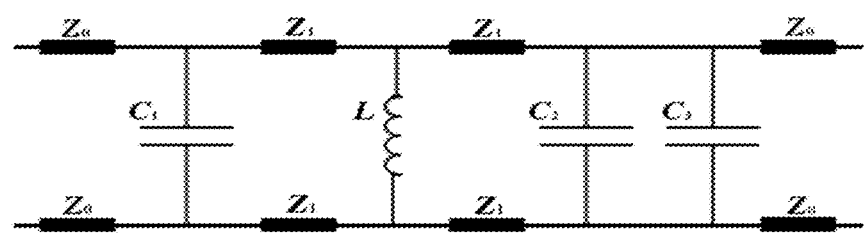
FIG. 13 is an equivalent circuit diagram of the radio-wave transparent structure according to the fourth implementation of the present disclosure.

FIG. 13 is an equivalent circuit diagram of the radio-wave transparent structure 120 according to the fourth implementation of the present disclosure. In this equivalent circuit diagram, factors that have small effects on the preset frequency band are ignored, such as an inductance of the first radio-wave transparent layer 121, an inductance of the third radio-wave transparent layer 123, and a capacitance of the second radio-wave transparent layer 122. In this equivalent circuit diagram, the first radio-wave transparent layer 121 is equivalent to a capacitor C1, the second radio-wave transparent layer 122 is equivalent to a capacitor C2, a coupling capacitance between the first radio-wave transparent layer 121 and the second radio-wave transparent layer 122 is equivalent to a capacitor C3, and the third radio-wave transparent layer 123 is equivalent to an inductance L. In addition, Z0 represents an impedance of the free space, Z1 represents an impedance of the dielectric substrate 110, and $Z1=Z0/(Dk)^{1/2}$. The preset frequency band has the center frequency f0, and $f0=1/[2\pi/(LC)^{1/2}]$. A ratio of a bandwidth $\Delta f$ to the center frequency f0 is proportional to $(L/C)^{"2}$. It can be seen that, the larger the size of each of the first patches 1211 or each of the second patches 1231, the lower the center frequency of the preset frequency band and the narrower the preset frequency band, that is, the larger the size of each first patch 1211 or each second patch 1231 is, the larger a capacitance of an equivalent circuit in the equivalent circuit diagram, the lower the center frequency of the preset frequency band, and the smaller the bandwidth of the preset frequency band. The smaller the width W1 of the mesh-grid structure 1221 of the second radio-wave transparent layer 122, the lower the center frequency of the preset frequency band and the wider the preset frequency band, that is, the smaller the width W1 of the mesh-grid structure 1221 of the second radio-wave transparent layer 122, the larger an inductance of the equivalent circuit, the lower the center frequency of the preset frequency band, and the larger the bandwidth of the preset frequency band. The larger the period P of the radio-wave transparent structure 120, the higher the center frequency of the preset frequency band and the wider the preset frequency band, that is, the larger the period of the radio-wave transparent structure 120, the smaller the capacitance of the equivalent circuit, the higher the center frequency of the preset frequency band, and the larger the bandwidth of the preset frequency band. The thicker the radio-wave transparent structure 120, the lower the center frequency of the preset frequency band and the narrower the preset frequency band. The larger the dielectric constant of the dielectric substrate 110, the lower the center frequency of the preset frequency band and the narrower the preset frequency band.

In an implementation, the first dielectric layer 111 and the second dielectric layer 112 made of glass generally have a dielectric constant falling within a range from 6 to 7.6. When the preset frequency band is a range of 20 GHz to 35 GHz, the first patch 1211 generally has a size falling within a range from 0.5 mm to 0.8 mm. A solid part of the mesh-grid structure of the second radio-wave transparent layer 122 generally has a width falling within a range from 0.1 mm to 0.5 mm (that is, the width W1 of the mesh-grid structure 1221 of the second radio-wave transparent layer 122 generally falls with a range from 0.1 mm to 0.5 mm). One period generally has a length falling within a range from 1.5 mm to 3 mm. When the radio-wave transparent structure 120 is applied to a battery cover (i.e., a cover covering a battery) of an electronic device, a distance between an upper surface of the antenna module 200 and an inner surface of the battery cover is generally larger than or equal to zero, and in an implementation, the distance is generally from 0.5 mm to 1.2 mm.

Figure 14:
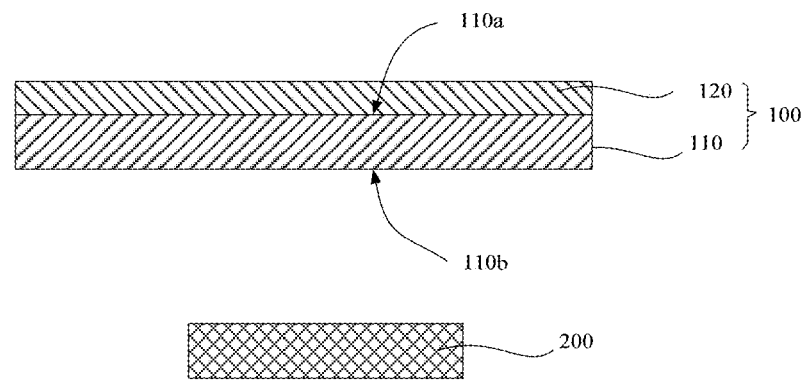
FIG. 14 is a schematic structural view of an antenna assembly according to the first implementation of the present disclosure.

FIG. 14 is a schematic structural view of the antenna assembly 10 according to the first implementation of the present disclosure. The antenna assembly 10 includes the antenna module 200 and the housing assembly 100. The antenna module 200 is configured to transmit and receive, within the preset direction range, the radio frequency signal in the preset frequency band, and the radio-wave transparent structure 120 of the housing assembly 100 is at least partially within the preset direction range. For the housing assembly 100, reference can be made to the housing assembly 100 described in the foregoing implementations, and details are not described herein again. For convenience, an example that the housing assembly 100 provided in the first implementation is taken for illustration of the antenna assembly 10 in this implementation.

Figure 15:
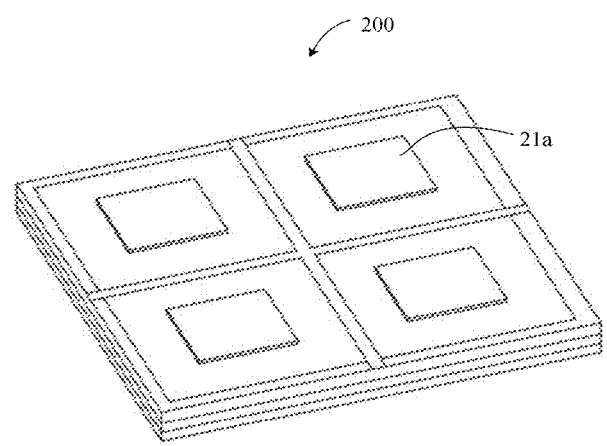
FIG. 15 is a schematic structural view of an antenna module of the antenna assembly according to the first implementation of the present disclosure.
Figure 16:
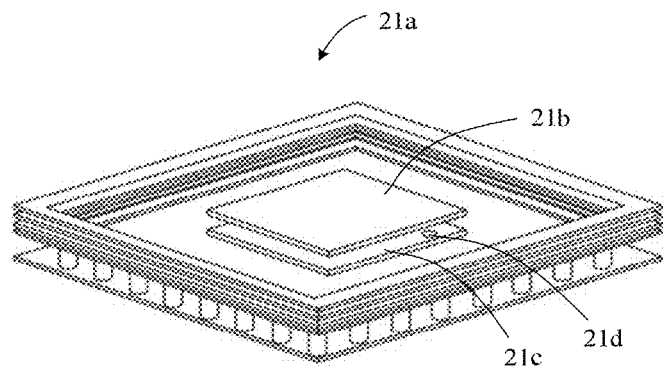
FIG. 16 is a schematic structural view of an antenna module of an antenna assembly according to an implementation of the present disclosure.
Figure 17:
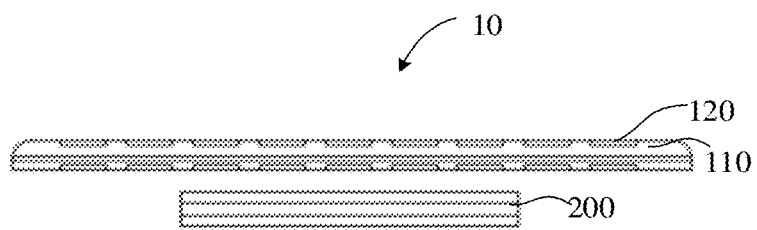
FIG. 17 is a schematic structural view of an antenna assembly according to another implementation of the present disclosure.

FIG. 15 is a schematic structural view of the antenna module 200 of the antenna assembly 10 according to the first implementation of the present disclosure. FIG. 16 is a schematic structural view of the antenna module 200 of the antenna assembly 10 according to an implementation of the present disclosure. FIG. 17 is a schematic structural view of the antenna assembly 10 according to another implementation of the present disclosure. The antenna module 200 illustrated in FIG. 15 includes four antenna elements 21a arranged in an array. As illustrated in FIG. 16, the antenna module 200 includes one antenna element 21a. The antenna element 21a includes a patch 21b and a patch 21c stacked with and spaced apart from the patch 21b. The patch 21b is disposed further close to a package surface of the antenna element 21a than the patch 21a. The patch 21c has at least one feeding point 21d. The at least one feeding point 21d is in electrical connection with the radio frequency chip 230, and the patch 21c is coupled with the patch 21b. FIG. 17 illustrates that the radio-wave transparent structure 120 is partially embedded in the dielectric substrate 110. A part of the radio-wave transparent structure 120 is embedded in the dielectric substrate 110 and a top surface of the part of the radio-wave transparent structure 120 is flush or substantially flush with a surface of the dielectric substrate 110 away from the antenna module 200, and another part of the radio-wave transparent structure 120 is embedded in the dielectric substrate 110 and a top surface of the other part of the radio-wave transparent structure 120 is flush or substantially flush with a surface of the dielectric substrate 110 close to the antenna module 200.

Figure 18:
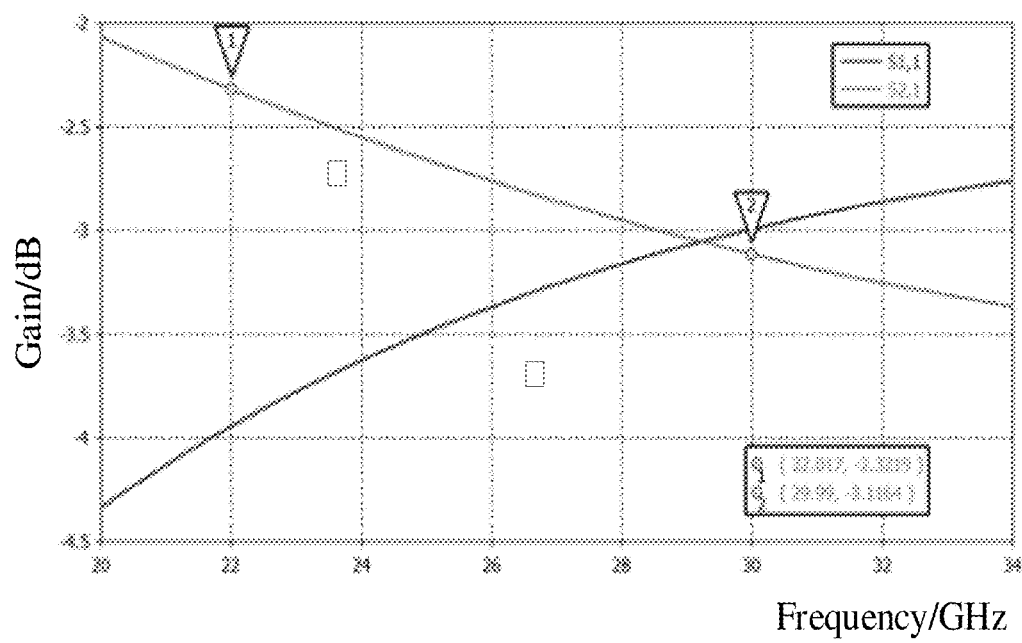
FIG. 18 is a schematic diagram illustrating a curve of reflection coefficient and a curve of transmission coefficient of an antenna module for a radio frequency signal in a frequency range from 20 GHz to 34 GHz when a conventional glass battery cover of 0.7 mm is provided.

FIG. 18 is a schematic diagram illustrating a curve of reflection coefficient and a curve of transmission coefficient of an antenna module for a radio frequency signal in a frequency range of 20 GHz to 34 GHz when a conventional glass battery cover having a thickness of 0.7 mm is provided. In FIG. 18, the horizontal axis represents the frequency in units of GHz, and the vertical axis represents the gain in units of dB. A curve ① is the curve of reflection coefficient. As can be seen from the curve ①, the gain is above −10 dB within the frequency range of 20 GHz to 34 GHz, that is, a reflection of a radio frequency (RF) signal is relatively large, and the reflection increases with an increase in the frequency. A curve ② is the curve of transmission coefficient. As can be seen from the curve ②, a gain loss is above −2.3 dB within the frequency range of 20 GHz to 30 GHz. As can be seen from the curve ① and the curve ②, when the conventional glass battery cover is provided, the antenna module 200 has a relatively large signal reflection and a relatively large transmission loss.

Figure 19:
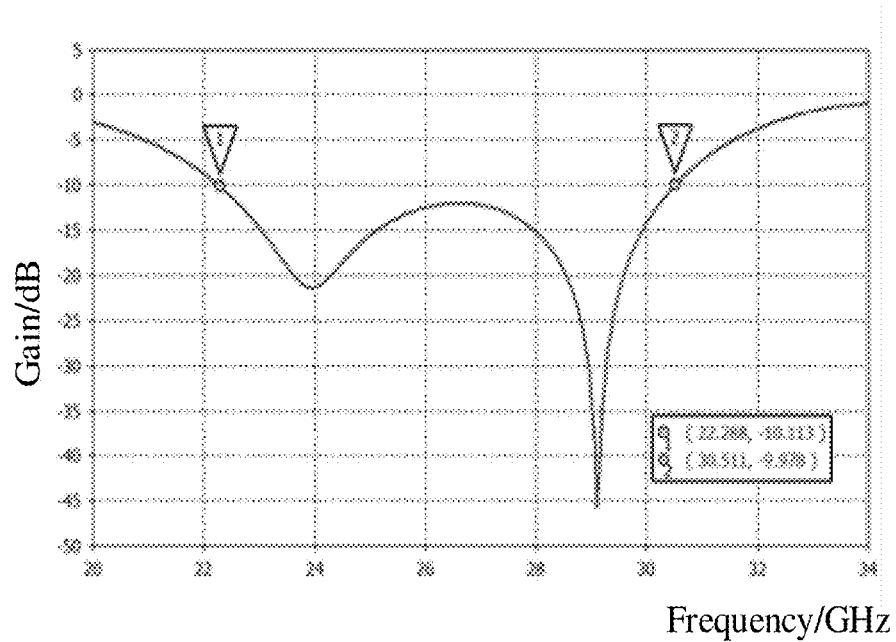
FIG. 19 is a schematic diagram illustrating a curve of reflection coefficient of an antenna module when a battery cover is provided with a radio-wave transparent structure.
Figure 20:
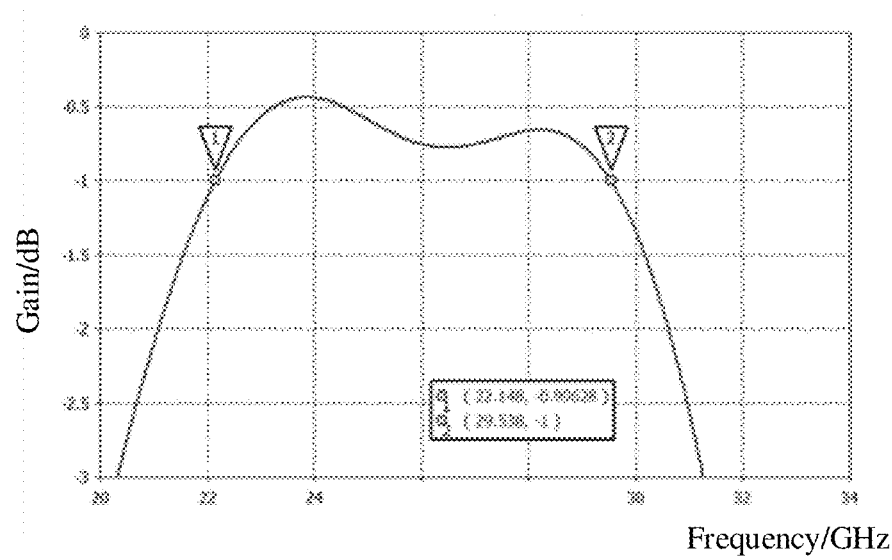
FIG. 20 is a schematic diagram illustrating a curve of transmission coefficient of an antenna module when a battery cover is provided with a radio-wave transparent structure.

FIG. 19 is a schematic diagram illustrating a curve of reflection coefficient of the antenna module 200 when the battery cover is provided with the radio-wave transparent structure 120. FIG. 20 is a schematic diagram illustrating a curve of transmission coefficient of the antenna module 200 when the battery cover is provided with the radio-wave transparent structure 120. In FIG. 19, the horizontal axis represents the frequency in units of GHz, and the vertical axis represents the gain in units of dB. As illustrated in FIG. 19, the antenna module 200 has a relative small reflection coefficient within a frequency range at which the gain is less than or equal to −10 dB. Thus, the frequency range at which the gain is less than or equal to −10 dB is defined as the operating frequency range of the antenna module 200. As illustrated in FIG. 19, the antenna module 200 has the operating frequency range of 22.288 GHz to 30.511 GHz. In FIG. 20, the horizontal axis represents the frequency in units of GHz, and the vertical axis represents the gain in units of dB. The antenna module 200 has a good transmission coefficient within a frequency range at which the gain is greater than −1 dB. As can be seen from the curve in FIG. 20, the antenna module 200 has a good transmission coefficient within a frequency range of 22.148 GHz to 29.538 GHz.

Figure 21:
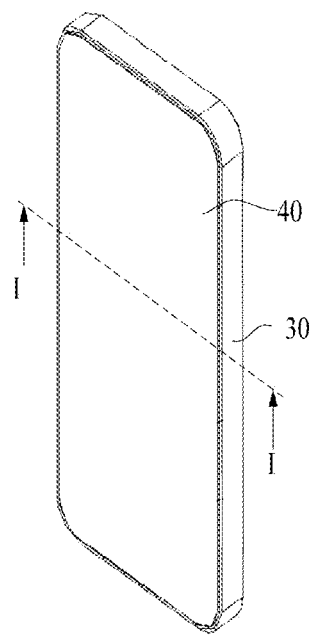
FIG. 21 is a schematic structural view of an electronic device according to a first implementation of the present disclosure.
Figure 22:
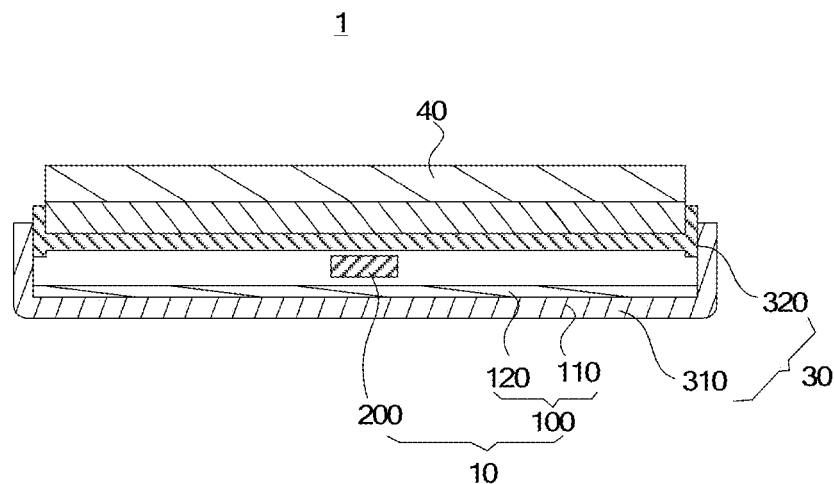
FIG. 22 is a schematic cross-sectional structural view of the electronic device illustrated in FIG. 21, taken along a line I-I.

FIG. 21 is a schematic structural view of the electronic device 1 according to the first implementation of the present disclosure. FIG. 22 is a schematic cross-sectional structural view of the electronic device 1 illustrated in FIG. 21, taken along a line I-I. The electronic device 1 includes the antenna assembly 10. For the antenna assembly 10, reference can be made to the foregoing implementations, and details are not described herein again. The dielectric substrate 110 includes the battery cover 30 of the electronic device 1. The battery cover 30 and a screen 40 together define an accommodation space. The accommodation space is used to accommodate functional elements of the electronic device 1. The electronic device 1 includes the antenna assembly 10 of any of the forgoing implementations.

As illustrated in FIG. 21 and FIG. 22, the dielectric substrate 110 includes the battery cover 30 of the electronic device 1, the battery cover 30 of the electronic device 1 includes a rear plate 310 and a frame 320 bent and extending from a peripheral edge of the rear plate 310, and the radio-wave transparent structure 120 is disposed corresponding to the rear plate 310.

The electronic device 1 includes, but is not limited to, an electronic device with a breathing light function, such as a smart phone, a mobile internet device (MID), an e-book, a play station portable (PSP), or a personal digital assistant (PDA). The electronic device 1 according to the present disclosure is described in detail below.

Figure 23:
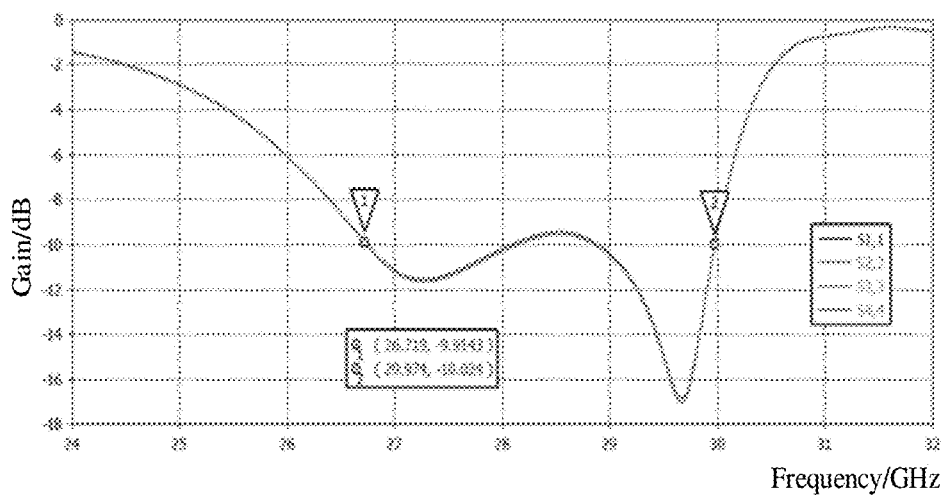
FIG. 23 is a schematic diagram illustrating a standing wave of an antenna module in free space.
Figure 24:
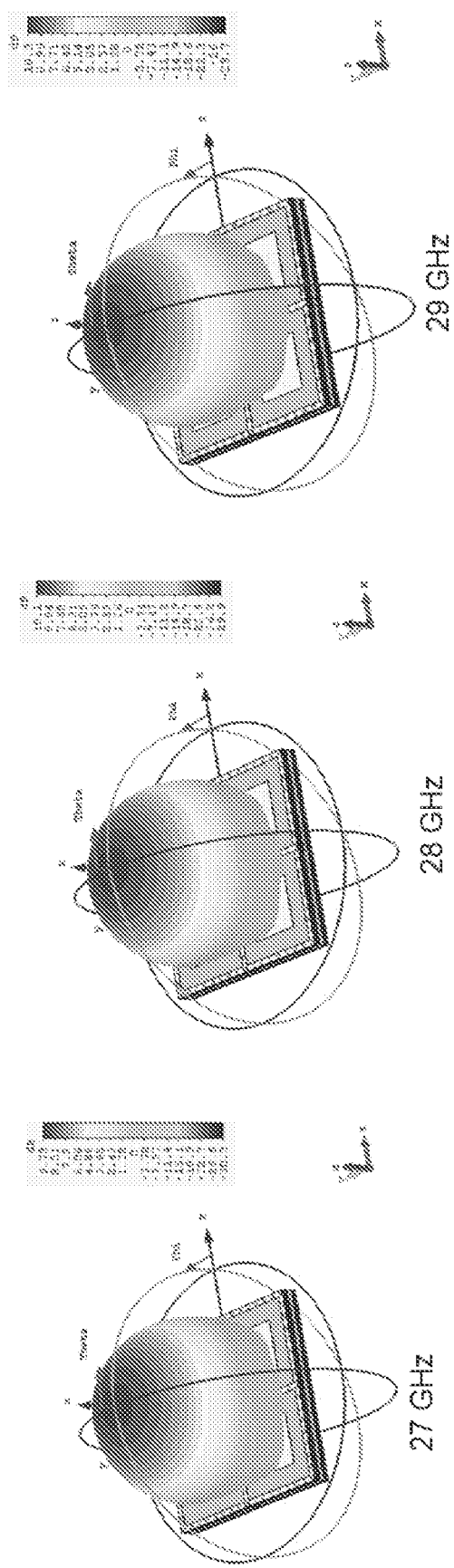
FIG. 24 illustrates radiation patterns of an antenna module in free space.

FIG. 23 is a schematic diagram illustrating a standing wave of the antenna module 200 in the free space. FIG. 24 illustrates radiation patterns illustrating the antenna module 200 in the free space. In FIG. 23 and FIG. 24, an example that the antenna module 200 has 2×2 antenna element array is taken for simulation. In FIG. 23, the horizontal axis represents the frequency in units of GHz, and the vertical axis represents the gain in units of dB. A frequency range of a curve of the standing wave at which the gain is less than or equal to −10 dB is taken as an operating frequency range of the antenna module 200. As illustrated in FIG. 23, the antenna module 200 has the operating frequency range of 26.71 GHz to 29.974 GHz. As illustrated in FIG. 24, the antenna module 200 has relatively high gains at frequencies of 27 GHz, 28 GHz, and 29 GHz. The antenna module 200 has a gain of 9.73 dB at the frequency of 27 GHz, a gain of 10.1 dB at the frequency of 28 GHz, and a gain of 10.3 dB at the frequency of 29 GHz. It can be seen that the antenna module 200 has relatively large gains at the frequencies of 27 GHz, 28 GHz, and 29 GHz. It is noted that due to a symmetrical design of the antenna module 200 of 2×2 array, curves of standing wave parameters of the four antenna elements of the antenna module 200 of 2×2 array in the free space coincide with each other. S11, S22, S33, and S44 in FIG. 23 respectively represent return losses of the four antenna elements of the antenna module 200 of 2×2 array.

Figure 25:
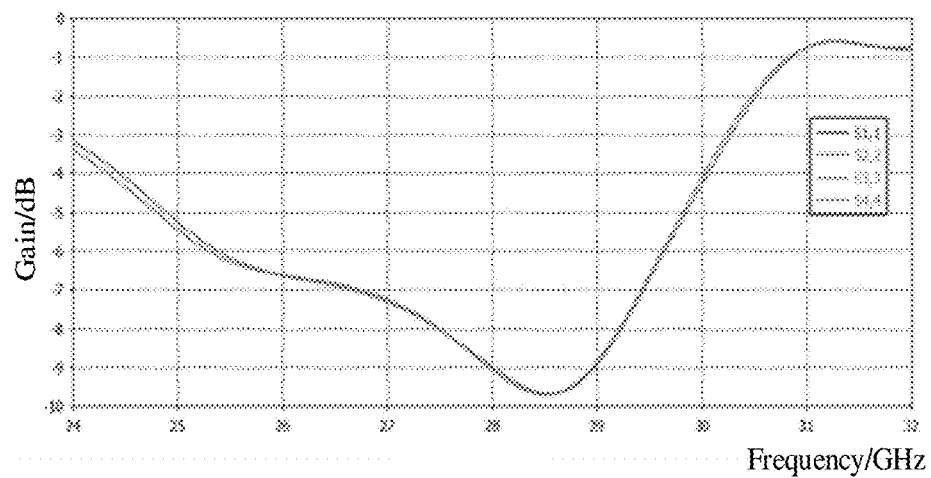
FIG. 25 is a schematic diagram illustrating a standing wave of an antenna module when a conventional battery cover is provided.
Figure 26:
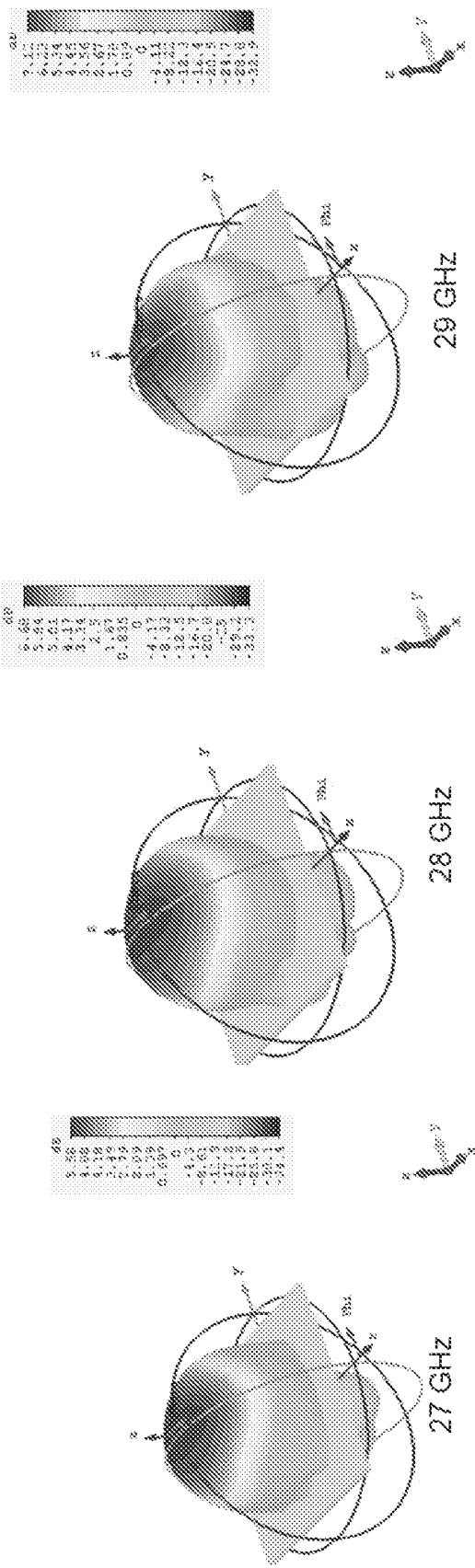
FIG. 26 illustrates radiation patterns of an antenna module when a conventional battery cover is provided.

FIG. 25 is a schematic diagram illustrating a standing wave of the antenna module 200 when a conventional battery cover is provided. FIG. 26 illustrates radiation patterns of the antenna module 200 when the conventional battery cover is provided. In FIG. 25 and FIG. 26, an example that the antenna module 200 has 2×2 antenna element array is taken for simulation. In FIG. 25, the horizontal axis represents the frequency in units of GHz, and the vertical axis represents the gain in units of dB. A frequency range of a curve of the standing wave at which the gain is less than or equal to −10 dB is taken as an operating frequency range of the antenna module 200. As illustrated in FIG. 25, the standing waves of the radio frequency signals in a frequency range of 24 GHz to 32 GHz are all above −10 dB, that is, amounts of reflections of the radio frequency signals in the frequency range of 24 GHz to 32 GHz are very large. As illustrated in FIG. 26, the antenna module 200 has a gain of 5.58 dB at a frequency of 27 GHz, a gain of 6.68 dB at a frequency of 28 GHz, and a gain of 7.12 dB at a frequency of 29 GHz. It can be seen that the antenna module 200 has a relatively large reflection coefficient and a relatively small gain when the traditional battery cover is provided.

It is noted that due to a symmetrical design of the antenna module 200 of 2×2 array, as illustrated in FIG. 25, a curve of the standing wave parameter S11 coincides with a curve of the standing wave parameter S33, and a curve of the standing wave parameter S22 coincides with a curve of the standing wave parameter S44. S11, S22, S33, and S44 in FIG. 25 respectively represent return losses of the four antenna elements of the antenna module 200 of 2×2 array.

Figure 27:
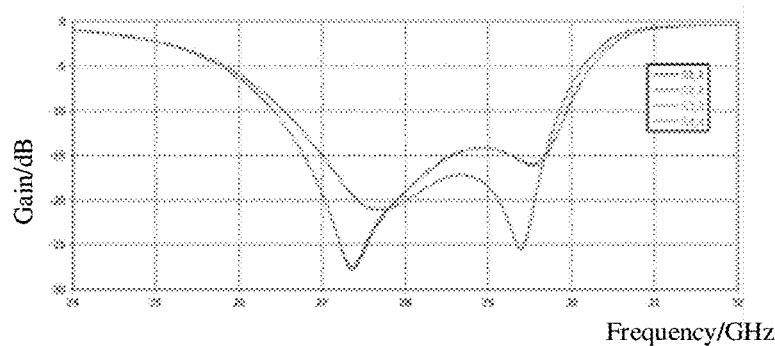
FIG. 27 is a schematic diagram illustrating a standing wave of an antenna module when a battery cover of the present disclosure is provided.
Figure 28:
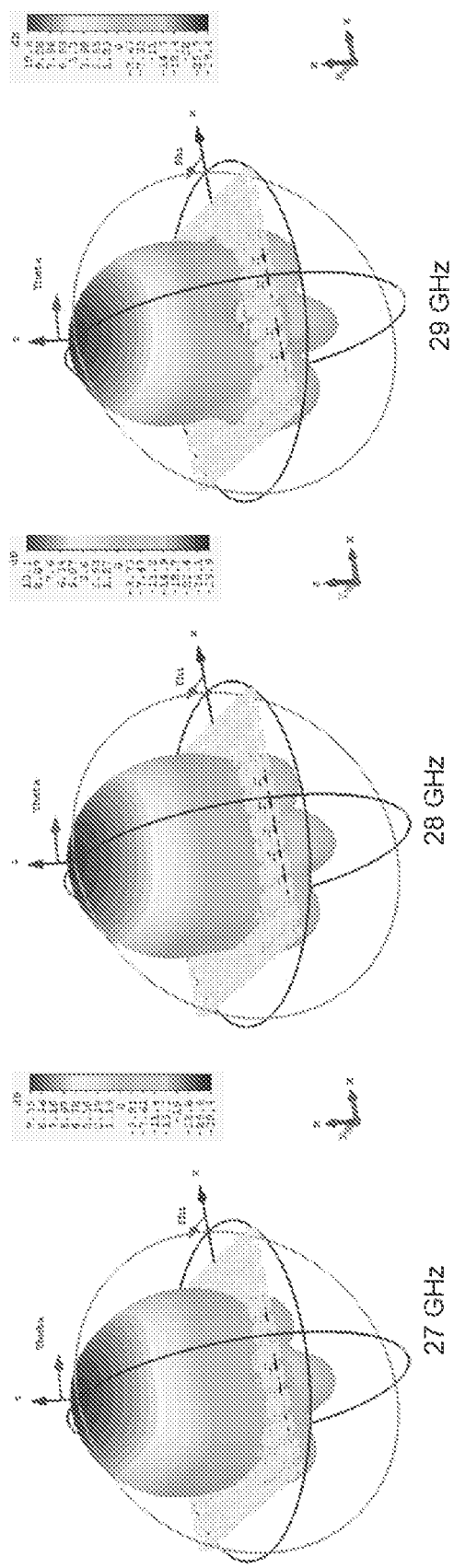
FIG. 28 illustrates radiation patterns of an antenna module when a battery cover of the present disclosure is provided.

FIG. 27 is a schematic diagram illustrating a standing wave of the antenna module 200 when the battery cover of the present disclosure is provided. FIG. 28 illustrates radiation patterns of the antenna module 200 when the battery cover of the present disclosure is provided. In FIG. 27 and FIG. 28, an example that the antenna module 200 has 2×2 antenna element array is taken for simulation. In FIG. 27, the horizontal axis represents the frequency in units of GHz, and the vertical axis represents the gain in units of dB. A frequency range of a curve of the standing wave at which the gain is less than or equal to −10 dB is taken as an operating frequency range of the antenna module 200. As can be seen from the curve of the standing wave illustrated in FIG. 27, the antenna module 200 has a relatively large operating frequency range. As illustrated in FIG. 28, the antenna module 200 has a gain of 9.55 dB at a frequency of 27 GHz, a gain of 10.1 dB at a frequency of 28 GHz, and a gain of 10.6 dB at a frequency of 29 GHz. It can be seen that the antenna module 200 has a relatively large operating frequency range and a relatively large gain when the battery cover 30 of the present disclosure is provided. When the battery cover 30 of the present disclosure is provided, the antenna module 200 has the operating frequency range and the gain that are substantially the same as those of the antenna module 200 in the free space.

It is noted that due to a symmetrical design of the antenna module 200 of 2×2 array, as illustrated in FIG. 27, a curve of the standing wave parameter S11 coincides with a curve of the standing wave parameter S33, and a curve of the standing wave parameter S22 coincides with a curve of the standing wave parameter S44. S11, S22, S33, and S44 in FIG. 27 respectively represent return losses of the four antenna elements of the antenna module 200 of 2×2 array.

Figure 29:
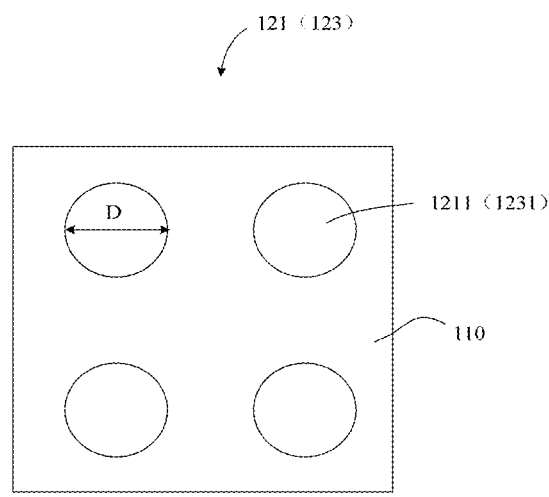
FIG. 29 is a schematic view of a first radio-wave transparent layer of a radio-wave transparent structure according to a fifth implementation of the present disclosure.

FIG. 29 is a schematic view of the first radio-wave transparent layer 121 of the radio-wave transparent structure 120 according to the fifth implementation of the present disclosure. The radio-wave transparent structure 120 in this implementation is substantially the same as the radio-wave transparent structure 120 in the fourth implementation, except that each first patch 1211 in the fourth implementation is rectangular, while the first radio-wave transparent layer 121 in this implementation includes multiple first patches 1211 arranged in an array, and each first patch 1211 in this implementation is in a circular shape. In an implementation, each first patch 1211 has a diameter D falling within a range from 0.5 mm to 0.8 mm.

In this implementation, the third radio-wave transparent layer 123 includes multiple second patches 1231 arranged in an array, and each of the multiple second patches 1231 is in a circular shape. In an implementation, each second patch 1231 has a diameter D falling within a range from 0.5 mm to 0.8 mm. It is noted that, the third radio-wave transparent layer 123 may be the same as the first radio-wave transparent layer 121 in structure.

Figure 30:
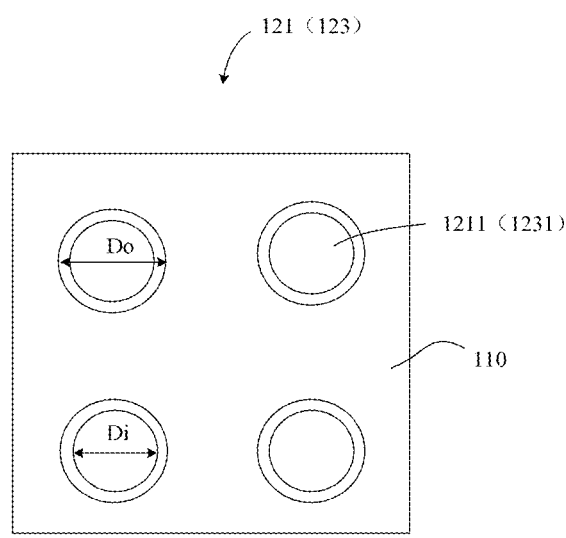
FIG. 30 is a schematic structural view of a first radio-wave transparent layer of a radio-wave transparent structure according to a sixth implementation of the present disclosure.

FIG. 30 is a schematic structural view of the first radio-wave transparent layer 121 of the radio-wave transparent structure 120 according to a sixth implementation of the present disclosure. The radio-wave transparent structure 120 in this implementation is substantially the same as the radio-wave transparent structure 120 in the fourth implementation, except that each first patch 1211 in the fourth implementation is rectangular, while the first radio-wave transparent layer 121 in this implementation includes multiple first patches 1211 arranged in an array, and each first patch 1211 in this implementation is in a ring shape. When each first patch 1211 is made of metal and in the ring shape, a light transmittance of the radio-wave transparent structure 120 can be improved, that is, a light transmittance (i.e., a transparency) of the housing assembly 100 can be improved. An improvement of the transparency of the housing assembly 100 is beneficial to improving the aesthetics of the electronic device 1. In an implementation, each first patch 1211 in the ring shape has an outer diameter Do falling within a range from 0.5 mm to 0.8 mm and an inner diameter Di. Generally, the smaller a difference between the outer diameter Do and the inner diameter Di (i.e., Do-Di) is, the larger the light transmittance of the radio-wave transparent structure 120 is, and the larger an insertion loss is. In other words, the smaller the value of Do-Di, the smaller an area occupied by the first patches 1211, and the larger the transparency of the housing assembly 100 and the larger the insertion loss. In order to balance the light transmittance (i.e., the transparency of the housing assembly 100) and the insertion loss of the radio-wave transparent structure 120, a value of Do-Di is generally larger than or equal to 0.5 mm. It is noted that, the third radio-wave transparent layer 123 may be the same as the first radio-wave transparent layer 121 in structure.

Figure 31:
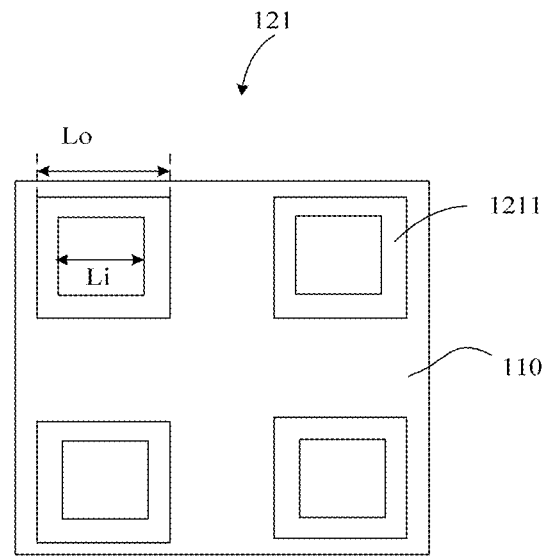
FIG. 31 is a schematic structural view of a first radio-wave transparent layer of a radio-wave transparent structure according to a seventh implementation of the present disclosure.

FIG. 31 is a schematic structural view of the first radio-wave transparent layer 121 of the radio-wave transparent structure 120 according to a seventh implementation of the present disclosure. The radio-wave transparent structure 120 in this implementation is substantially the same as the radio-wave transparent structure 120 in the fourth implementation, except that each first patch 1211 in the fourth implementation is rectangular, while the first radio-wave transparent layer 121 in this implementation includes multiple first patches 1211 arranged in an array, and each first patch 1211 in this implementation is in a square ring shape. In an implementation, each first patch 1211 generally has an outer side length Lo falling within a range from 0.5 mm to 0.8 mm, and an inner side length Li. Generally, the smaller a value of Lo−Li (i.e., a difference between the outer side length Lo and the inner side length Li) is, the larger the light transmittance is, and the larger the insertion loss is. In other words, the smaller the value of Lo−Li, the small an area occupied by the first patches 1211, and the larger the transparency of the housing assembly 100 and the larger the insertion loss. In order to balance the light transmittance (i.e., the transparency of the housing assembly 100) and the insertion loss of the radio-wave transparent structure 120, the value of Lo−Li is generally larger than or equal to 0.5 mm. It is noted that, the third radio-wave transparent layer 123 may be the same as the first radio-wave transparent layer 121 in structure.

Figure 32:
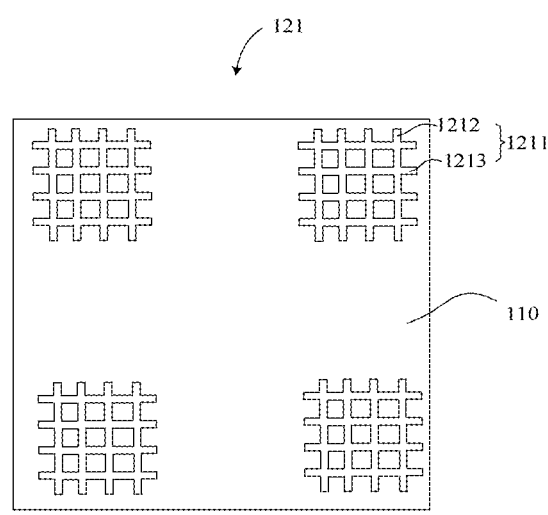
FIG. 32 is a schematic structural view of a first radio-wave transparent layer of a radio-wave transparent structure according to an eighth implementation of the present disclosure.

FIG. 32 is a schematic structural view of the first radio-wave transparent layer 121 of the radio-wave transparent structure 120 according to an eighth implementation of the present disclosure. The radio-wave transparent structure 120 in this implementation includes multiple first patches 1211 arranged in an array, and each first patch 1211 is a metal mesh-grid patch in a square shape. In an implementation, the first patch 1211 includes multiple first branches 1212 and multiple second branches 1213. The multiple first branches 1212 are spaced apart from each other, the multiple second branches 1213 are spaced apart from each other, and the multiple second branches 1213 and the multiple first branches 1212 are intersected and connected. In an implementation, the multiple first branches 1212 extend along a first direction and are spaced apart from each other along a second direction. In an implementation, the multiple second branches 1213 intersects and are perpendicular to the multiple first branches 1212. In an implementation, each first branch 1212 has a side length falling within a range from 0.5 mm to 0.8 mm.

Figure 33:
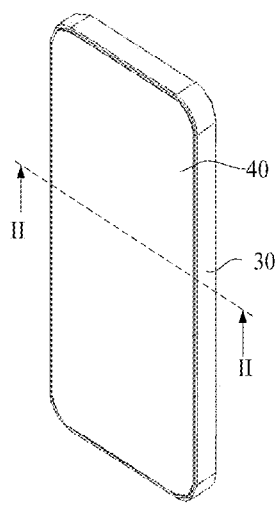
FIG. 33 is a schematic structural view of an electronic device according to the second implementation of the present disclosure.
Figure 34:
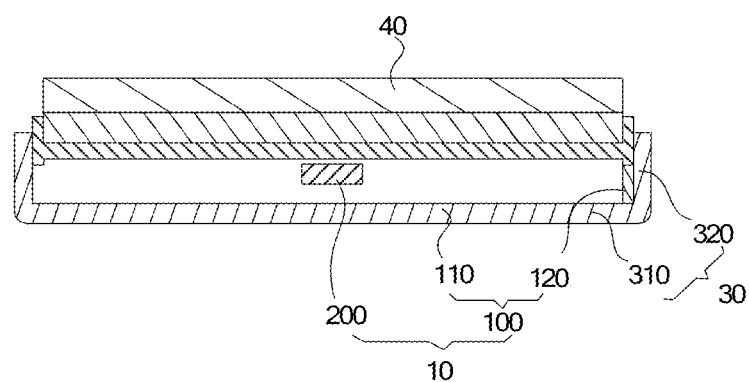
FIG. 34 is a schematic cross-sectional structural view of the electronic device illustrated in FIG. 33, taken along a line II-II.

FIG. 33 is a schematic structural view of the electronic device 1 according to the second implementation of the present disclosure. FIG. 34 is a schematic cross-sectional structural view of the electronic device 1 illustrated in FIG. 33, taken along a line II-II. The electronic device 1 includes the antenna assembly 10. For the antenna assembly 10, reference can be made to the foregoing implementations, and details are not described herein again. The dielectric substrate 110 includes a battery cover 30 of the electronic device 1. The battery cover 30 of the electronic device 1 includes a rear plate 310 and a frame 320 bent and extending from a peripheral edge of the rear plate 310. The radio-wave transparent structure 120 is provided corresponding to the frame 320.

Figure 35:
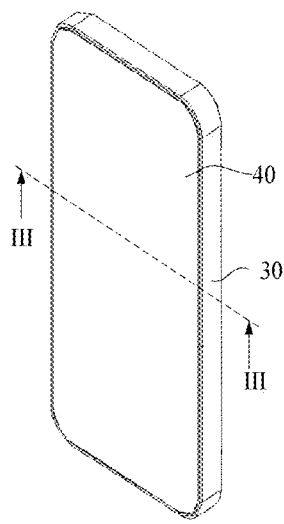
FIG. 35 is a schematic structural view of an electronic device according to the third implementation of the present disclosure.
Figure 36:
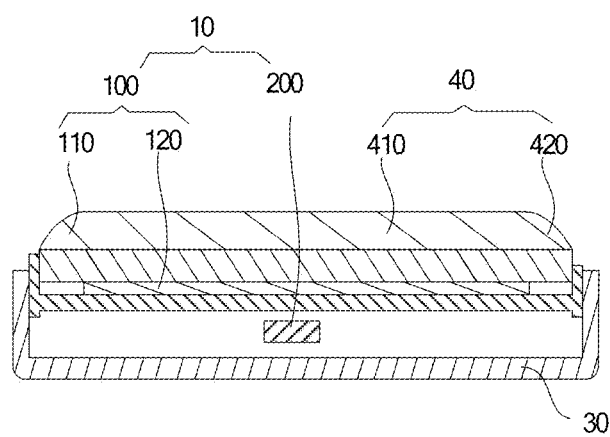
FIG. 36 is a schematic cross-sectional structural view of the electronic device illustrated in FIG. 35, taken along a line III-III.

FIG. 35 is a schematic structural view of the electronic device 1 according to the third implementation of the present disclosure. FIG. 36 is a schematic cross-sectional structural view of the electronic device 1 illustrated in FIG. 35, taken along a line III-III. The electronic device 1 includes an antenna assembly 10. For the antenna assembly 10, reference can be made to the foregoing implementations, and details are not described herein again. The dielectric substrate 110 includes a screen 40 of the electronic device 1.

In an implementation, the dielectric substrate 110 includes the screen 40 of the electronic device 1, the screen 40 includes a screen body 410 and an extending portion 420 bent and extending from a peripheral edge of the screen body 410. The radio-wave transparent structure 120 is disposed corresponding to the screen body 410.

Figure 37:
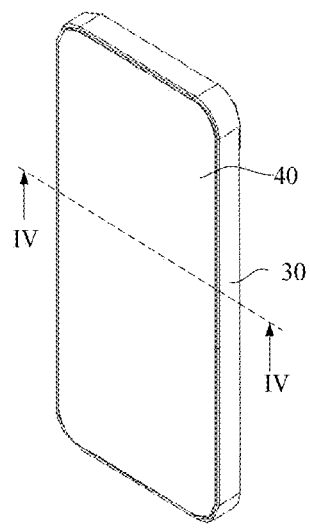
FIG. 37 is a schematic structural view of an electronic device according to the fourth implementation of the present disclosure.
Figure 38:
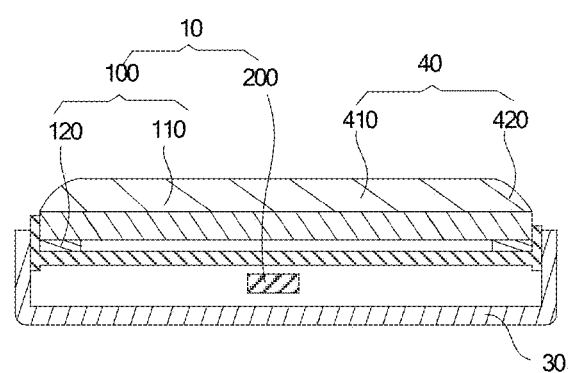
FIG. 38 is a schematic cross-sectional structural view of the electronic device illustrated in FIG. 37, taken along a line IV-IV.

FIG. 37 is a schematic structural view of the electronic device 1 according to the fourth implementation of the present disclosure. FIG. 38 is a schematic cross-sectional structural view of the electronic device 1 illustrated in FIG. 37, taken along a line IV-IV. The electronic device 1 includes the antenna assembly 10. For the antenna assembly 10, reference can be made to the foregoing implementations, and details are not described herein again. The dielectric substrate 110 includes a screen 40 of the electronic device 1. The screen 40 includes the screen body 410 and the extending portion 420 bent and extending from a peripheral edge of the screen body 410. The radio-wave transparent structure 120 is disposed corresponding to the extending portion 420.

Figure 39:
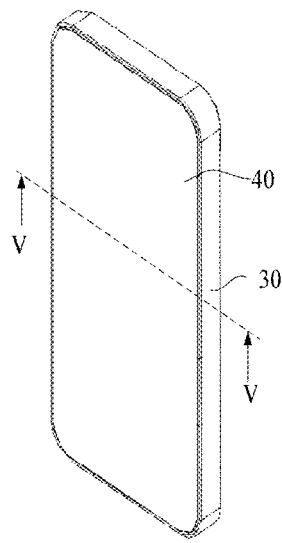
FIG. 39 is a schematic structural view of an electronic device according to the fifth implementation of the present disclosure.
Figure 40:
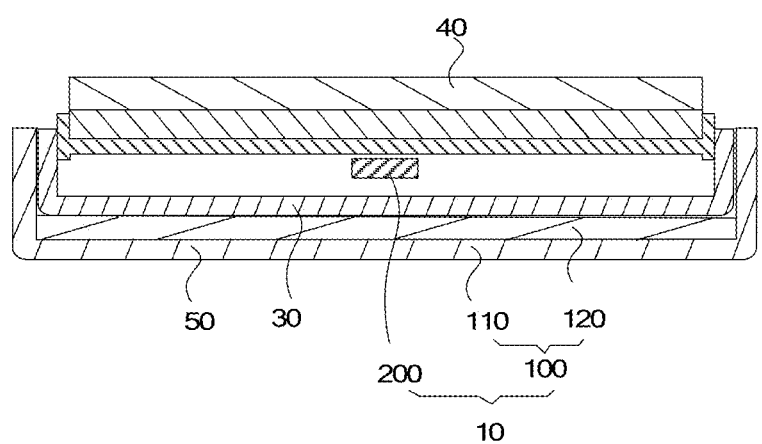
FIG. 40 is a schematic cross-sectional structural view of the electronic device illustrated in FIG. 39, taken along a line V-V.

FIG. 39 is a schematic structural view of the electronic device 1 according to the fifth implementation of the present disclosure. FIG. 40 is a schematic cross-sectional structural view of the electronic device 1 illustrated in FIG. 39, taken along a line V-V. The electronic device 1 includes the antenna assembly 10. For the antenna assembly 10, reference can be made to the foregoing implementations, and details are not described herein again. The electronic device 1 includes a battery cover 30 and a protective cover 50. The protective cover 50 covers a surface of the battery cover 30 to protect the battery cover 30. The dielectric substrate 110 includes the protective cover 50. The radio-wave transparent structure 120 is disposed corresponding to the protective cover 50.

Figure 41:
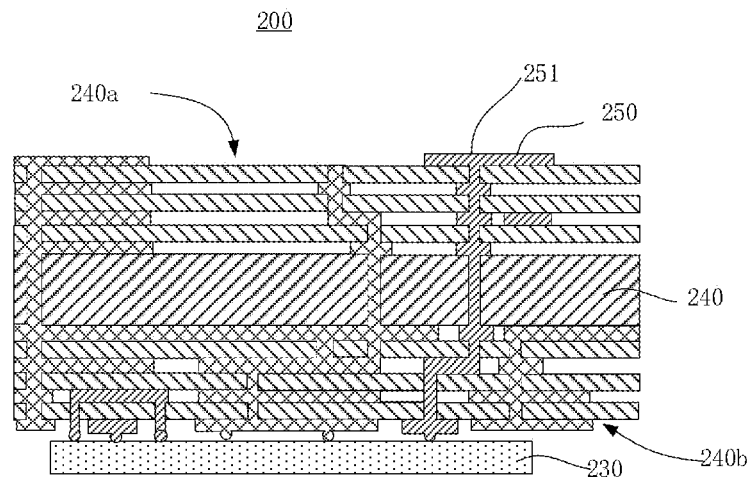
FIG. 41 is a schematic cross-sectional structural view of an antenna module according to an implementation of the present disclosure.

FIG. 41 is a schematic cross-sectional structural view of the antenna module 200 according to an implementation of the present disclosure. The antenna module 200 includes a radio frequency chip 230, an insulating substrate 240, and at least one first antenna radiator 250. The radio frequency chip 230 is configured to generate an excitation signal (also referred to as a radio frequency signal). The radio frequency chip 230 is further away from the radio-wave transparent structure 120 than the at least one first antenna radiator 250. The insulating substrate 240 carries the at least one first antenna radiator 250. The radio frequency chip 230 is electrically coupled with the at least one first antenna radiator 250 via transmission lines embedded in the insulating substrate 240. In an implementation, the insulating substrate 240 includes a third surface 240a and a fourth surface 240b opposite the third surface 240a. The insulating substrate 240 carries the at least one first antenna radiator 250. In the implementation, the at least one first antenna radiator 250 is disposed on the third surface 240a. Alternatively, the at least one first antenna radiator 250 is embedded in the insulating substrate 240. As an example, in FIG. 41, the at least one first antenna radiator 250 is disposed on the third surface 240a, and the radio frequency chip 230 is disposed on the fourth surface 240b. The excitation signal generated by the radio frequency chip 230 is transmitted to the at least one first antenna radiator 250 via the transmission lines embedded in the insulating substrate 240. The radio frequency chip 230 may be soldered on the insulating substrate 240 such that the excitation signal is transmitted to each first antenna radiator 250 via the transmission lines embedded in the insulating substrate 240. Each first antenna radiator 250 receives the excitation signal and generates a millimeter wave signal according to the excitation signal. Each first antenna radiator 250 may be, but is not limited to, a patch antenna.

Further, the radio frequency chip 230 is further away from the radio-wave transparent structure 120 than the at least one first antenna radiator 250. An output terminal of the radio frequency chip 230 used to output the excitation signal is disposed at a side of the insulating substrate 240 away from the radio-wave transparent structure 120. That is, the radio frequency chip 230 is disposed close to the fourth surface 240b of the insulating substrate 240 and away from the third surface 240a of the insulating substrate 240.

Further, each first antenna radiator 250 includes at least one feeding point 251. Each feeding point 251 is electrically coupled with the radio frequency chip 230 via the transmission lines. For each feeding point 251 of each first antenna radiator 250, a distance between the feeding point 251 and a center of the first antenna radiator 250 is larger than a preset distance. An adjustment of a position of the feeding point 251 can change an input impedance of the first antenna radiator 250. In this implementation, for each feeding point 251 of each first antenna radiator 250, by setting the distance between the feeding point 251 and the center of the first antenna radiator 250 to be larger than the preset distance, the input impedance of the first antenna radiator 250 is adjusted. The input impedance of the first antenna radiator 250 is adjusted to enable the input impedance of the first antenna radiator 250 to match an output impedance of the radio frequency chip 230. When the input impedance of the first antenna radiator 250 matches the output impedance of the radio frequency chip 230, a reflection amount of the excitation signal generated by the radio frequency signal is minimal.

Figure 42:
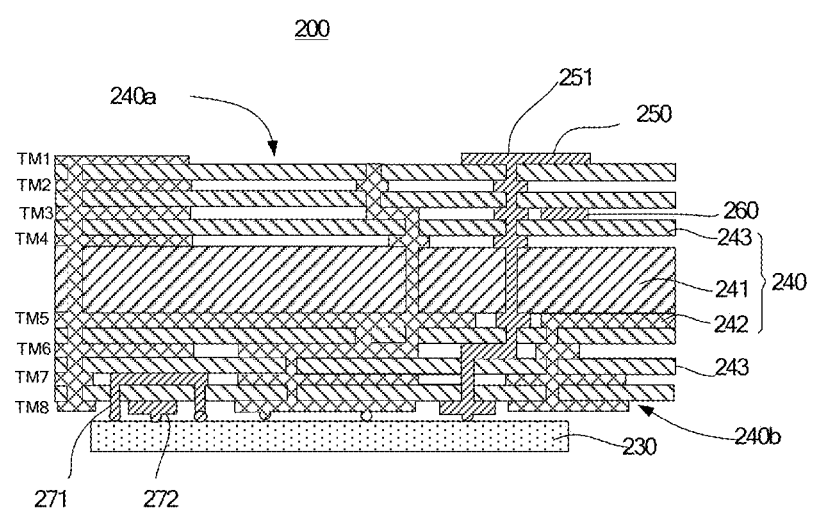
FIG. 42 is a schematic cross-sectional structural view of an antenna module according to another implementation of the present disclosure.

FIG. 42 is a schematic cross-sectional view of the antenna module 200 according to another implementation of the present disclosure. The antenna module 200 provided in this implementation is substantially the same as the antenna module 200 provided in the first implementation, except that the antenna module 200 in this implementation further includes at least one second antenna radiator 260. That is, in this implementation, the antenna module 200 includes the radio frequency chip 230, the insulating substrate 240, the at least one first antenna radiator 250, and the at least one second antenna radiator 260. The radio frequency chip 230 is configured to generate the excitation signal. The insulating substrate 240 includes the third surface 240a and the fourth surface 240b opposite the third surface 240a. The at least one first antenna radiator 250 is disposed on the third surface 240a, and the radio frequency chip 230 is disposed on the fourth surface 240b. The excitation signal generated by the radio frequency chip 230 is transmitted to the at least one first antenna radiator 250 via the transmission lines embedded in the insulating substrate 240. The radio frequency chip 230 can be soldered on the insulating substrate 240 such that the excitation signal is transmitted to each first antenna radiator 250 via the transmission lines embedded in the insulating substrate 240. Each first antenna radiator 250 receives the excitation signal and generates a millimeter wave signal according to the excitation signal.

Further, the radio frequency chip 230 is further away from the radio-wave transparent structure 120 than the at least one first antenna radiator 250. The output terminal of the radio frequency chip 230 used to output the excitation signal is disposed at the side of the insulating substrate 240 away from the radio-wave transparent structure 120.

Further, each first antenna radiator 250 includes the at least one feeding point 251. Each feeding point 251 is electrically coupled with the radio frequency chip 230 via the transmission lines. For each feeding point 251 of each first antenna radiator 250, the distance between the feeding point 251 and the center of the first antenna radiator 250 is smaller than the preset distance.

In this implementation, the at least one second antenna radiator 260 is embedded in the insulating substrate 240. The at least one second antenna radiator 260 is spaced apart from the at least one first antenna radiator 250, and the at least one second antenna radiator 260 is coupled with the at least one first antenna radiator 250 to form a stacked patch antenna. When the at least one second antenna radiator 260 is coupled with the at least one first antenna radiator 250 to form the stacked patch antenna, the at least one first antenna radiator 250 is electrically connected with the radio frequency chip 230, while the at least one second antenna radiator 260 is not electrically connected with the radio frequency chip 230. The at least one second antenna radiator 260 couples with the millimeter wave signal radiated by the at least one first antenna radiator 250 and generates a new millimeter wave signal according to the millimeter wave signal radiated by the at least one first antenna radiator 250, where the at least one second antenna radiator 260 is coupled with the at least one first antenna radiator 250.

In an implementation, an example that the antenna module 200 is manufactured through the HDI process is given below for illustration. The insulating substrate 240 includes a core layer 241 and multiple wiring layers 242 stacked on opposite sides of the core layer 241. The core layer 241 is an insulating layer, and an insulating layer 123 is sandwiched between each two adjacent wiring layers 242. The insulating layer 123 can also be called a prepreg (PP) layer. The wiring layer 242 disposed at a side of the core layer 241 close to the radio-wave transparent structure 120 and furthest away from the core layer 241 has an outer surface forming at least part of the third surface 240a of the insulating substrate 240. The wiring layer 242 disposed at a side of the core layer 241 away from the radio-wave transparent structure 120 and furthest away from the core layer 241 has an outer surface forming the fourth surface 240b of the insulating substrate 240. The at least one first antenna radiator 250 is disposed on the third surface 240a. The at least one second antenna radiator 260 is embedded in the insulating substrate 240. That is, the at least one second antenna radiator 260 can be disposed on other wiring layers 122 which are used for arranging antenna radiators, and the at least one second antenna radiator 260 is not disposed on a surface of the insulating substrate 240.

In this implementation, an example that the insulating substrate 240 with an eight-layer structure is given below for illustration. It is noted that, in other implementations, the number of layers of the insulating substrate 240 may be other. The insulating substrate 240 includes the core layer 241, a first wiring layer TM1, a second wiring layer TM2, a third wiring layer TM3, a fourth wiring layer TM4, a fifth wiring layer TM5, a sixth wiring layer TM6, and a seventh wiring layer TM7, and an eighth wiring layer TM8. The first wiring layer TM1, the second wiring layer TM2, the third wiring layer TM3, and the fourth wiring layer TM4 are indirectly stacked together on a surface of the core layer 241. Alternatively, the first wiring layer TM1, the second wiring layer TM2, the third wiring layer TM3, and the fourth wiring layer TM4 are indirectly stacked together, and the fourth wiring layer TM4 is disposed on a surface of the core layer 241 away from the radio frequency chip 230. The first wiring layer TM1 is disposed further away from the core layer 241 than the fourth wiring layer TM4. A surface of the first wiring layer TM1 away from the core layer 241 forms at least a part of the third surface 240a of the insulating substrate 240. The fifth wiring layer TM5, the sixth wiring layer TM6, the seventh wiring layer TM7, and the eighth wiring layer TM8 are indirectly stacked together on another surface of the core layer 241. Alternatively, the fifth wiring layer TM5, the sixth wiring layer TM6, the seventh wiring layer TM7, and the eighth wiring layer TM8 are indirectly stacked together, and the fifth wiring layer TM5 is disposed on a surface of the core layer 241 close to the radio frequency chip 230. The eighth wiring layer TM8 is disposed further away from the core layer 241 than the fifth wiring layer TM5. A surface of the eighth wiring layer TM8 away from the core layer 241 is the fourth surface 240b of the insulating substrate 240. Normally, the first wiring layer TM1, the second wiring layer TM2, the third wiring layer TM3, and the fourth wiring layer TM4 form wiring layers 122 that can be provided with the antenna radiators. The fifth wiring layer TM5 is a ground layer on which a ground electrode is provided. The sixth wiring layer TM6, the seventh wiring layer TM7, and the eighth wiring layer TM8 form wiring layers in which a feeding network and control lines of the antenna module 200 are provided. In another implementation, the sixth wiring layer TM6 and the seventh wiring layer TM7 form wiring layers on which the feeding network and the control lines of the antenna module 200 are provided. The radio frequency chip 230 is soldered on the eighth wiring layer TM8. In this implementation, the at least one first antenna radiator 250 is disposed on the surface of the first wiring layer TM1 away from the core layer 241 (alternatively, the at least one first antenna radiator 250 can be disposed on the first surface 240a), and the at least one second antenna radiator 260 is disposed in the third wiring layer TM3. As an example, as illustrated in FIG. 42, the at least one first antenna radiator 250 is disposed on the surface of the first wiring layer TM1 and the at least one second antenna radiator 260 is disposed in the third wiring layer TM3. It is noted that, in other implementations, the at least one first antenna radiator 250 may be disposed on the surface of the first wiring layer TM1 away from the core layer 241, and the at least one second antenna radiator 260 may be disposed in the second wiring layer TM2 or the fourth wiring layer TM4.

Further, the first wiring layer TM1, the second wiring layer TM2, the third wiring layer 242, the third wiring layer TM3, the fourth wiring layer TM4, the sixth wiring layer TM6, and the seventh wiring layer TM7, and the eighth wiring layer TM8 in the insulating substrate 240 are all electrically connected to the fifth wiring layer TM5 which is the ground layer. In an implementation, the first wiring layer TM1, the second wiring layer TM2, the third wiring layer TM3, the fourth wiring layer TM4, the sixth wiring layer TM6, and the seventh wiring layer TM7, and the eighth wiring layer TM8 in the insulating substrate 240 all define through holes, and each through hole is filled with a metal material electrically coupled with the ground layer, such that components in each wiring layer 242 is grounded.

Further, the seventh wiring layer TM7 and the eighth wiring layer TM8 are further provided with power lines 271 and control lines 272. The power lines 271 and the control lines 272 are electrically coupled with the radio frequency chip 230 respectively. The power lines 271 are used to provide the radio frequency chip 230 with required power, and the control lines 272 are used to transmit control signals to the radio frequency chip 230 to control the operation of the radio frequency chip 230.

Figure 43:
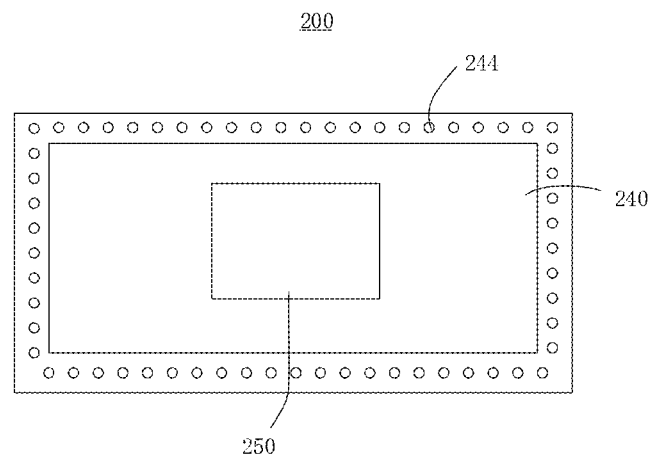
FIG. 43 is a schematic structural view of a packaged antenna module according to an implementation of the present disclosure.
Figure 44:
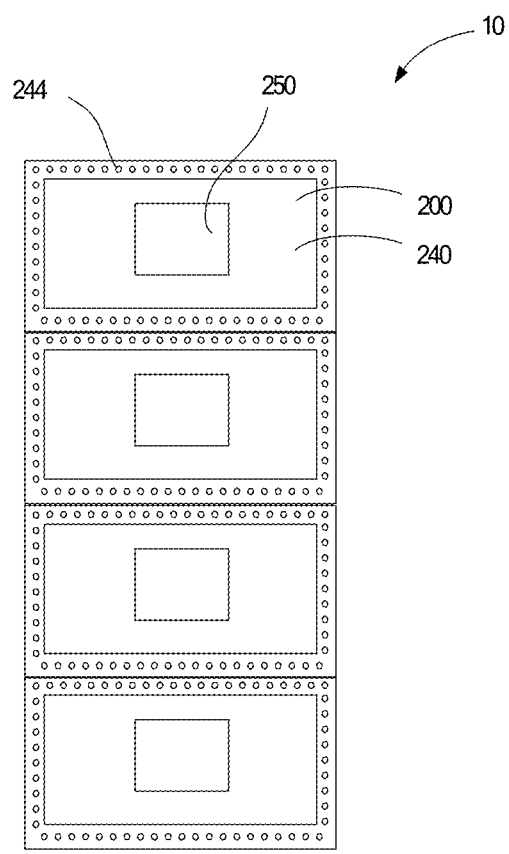
FIG. 44 is a schematic structural view of a radio frequency antenna array constructed with M×N packaged antenna assemblies according to an implementation of the present disclosure.

FIG. 43 is a schematic structural view of a packaged antenna module 200 according to an implementation of the present disclosure. FIG. 44 is a schematic view of a radio frequency antenna array constructed with M×N antenna assemblies 10 according to an implementation of the present disclosure. The electronic device 1 includes the radio frequency antenna array with M×N antenna assemblies 10, where M is a positive integer and N is a positive integer. As illustrated in FIG. 44, the radio frequency antenna array includes 4×1 antenna assemblies 10. For each antenna module 200 in the antenna assembly 10, the insulting substrate 240 further defines multiple metallized via grids 244 arranged around each first antenna radiator 250 to improve isolation between each two adjacent first antenna radiators 250. FIG. 44 is a schematic structural view of a radio frequency antenna array constructed with packaged antenna assemblies 10 according to an implementation of the present disclosure. When the metalized via grids 244 are defined in multiple antenna modules 200 to achieve a radiation frequency antenna array, the metalized via grids 244 are used to improve the isolation between each two adjacent antenna modules 200, so as to reduce or even avoid the interference of millimeter wave signals generated by the multiple antenna modules 200.

An example that the antenna module 200 includes a patch antenna and a stacked patch antenna is given for illustration. It is noted that the antenna module 200 may further include a dipole antenna, a magnetic electric dipole antenna, a quasi-Yagi antenna, and the like. The antenna assembly 10 may include a patch antenna, a stacked patch antenna, a dipole antenna, a magnetic dipole antenna, or a quasi-Yagi antenna. Alternatively, the antenna assembly 10 may include a combination of at least two of a patch antenna, a stacked patch antenna, a dipole antenna, a magnetic dipole antenna, or a quasi-Yagi antenna. Further, the dielectric substrates 110 of the M×N antenna assemblies 10 may be connected to each other into an integrated structure.

Figure 45:
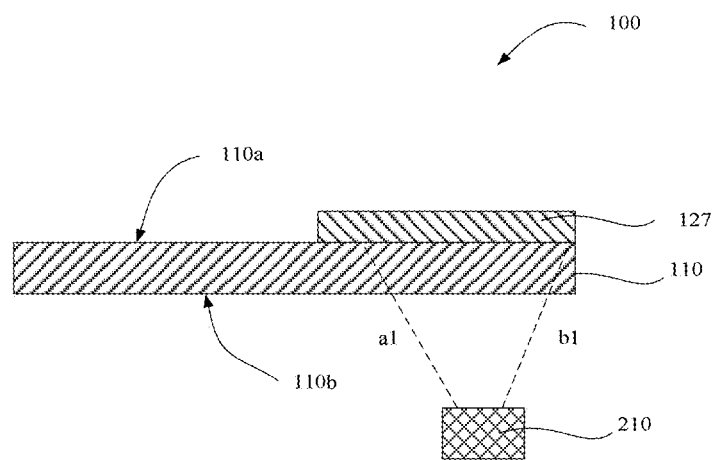
FIG. 45 is a schematic structural view of an electronic device according to the sixth implementation of the present disclosure.

FIG. 45 is a schematic structural view of the electronic device 1 according to the sixth implementation of the present disclosure. The electronic device 1 includes a first antenna module 210, a dielectric substrate 110, and a first radio-wave transparent structure 127. The first antenna module 210 is configured to transmit and receive, within a first preset direction range, a first radio frequency signal in a first frequency band. The dielectric substrate 110 is spaced apart from the first antenna module 210, and at least part of the dielectric substrate 110 is within the first preset direction range. A part of the dielectric substrate 110 within the first preset direction range has a first transmittance for the first radio frequency signal in the first frequency band. The first radio-wave transparent structure 127 is disposed on the dielectric substrate 110, and the first radio-wave transparent structure 127 is partially within the first preset direction range. A region of the electronic device 1 corresponding to the first radio-wave transparent structure 127 has a second transmittance for the first radio frequency signal in the first frequency band, and the second transmittance is larger than the first transmittance. As illustrated in FIG. 45, the first preset direction range is defined by a dashed line a1 and a dashed line b2.

Figure 46:
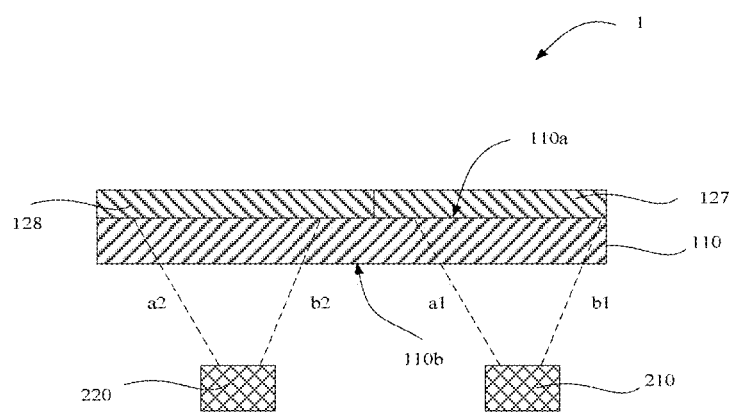
FIG. 46 is a schematic structural view of an electronic device according to the seventh implementation of the present disclosure.

FIG. 46 is a schematic structural view of the electronic device 1 according to the seventh implementation of the present disclosure. The electronic device 1 further includes a second antenna module 220 and a second radio-wave transparent structure 128. The second antenna module 220 is spaced apart from the first antenna module 210 and the second antenna module 220 is disposed outside the first preset direction range. The second antenna module 220 is configured to transmit and receive, within a second preset direction range, a second radio frequency signal in a second frequency band. The dielectric substrate 110 is also spaced apart from the second antenna module 220. At least part of the dielectric substrate 110 is within the second preset direction range, and the at least part of the dielectric substrate 110 within the second preset direction range has a third transmittance for the second radio frequency signal in the second frequency band. The second radio-wave transparent structure 128 is disposed on the dielectric substrate 110, and at least part of the second radio-wave transparent structure 128 is within the second preset direction range. A region of the electronic device 1 corresponding to the second radio-wave transparent structure 128 has a fourth transmittance for the second radio frequency signal in the second frequency band, where the fourth transmittance is larger than the third transmittance. As illustrated in FIG. 46, the first preset direction range is defined by a dashed line a1 and a dashed line b2, and the second preset direction range is defined by a dashed line a2 and a dashed line b2.

Figure 47:
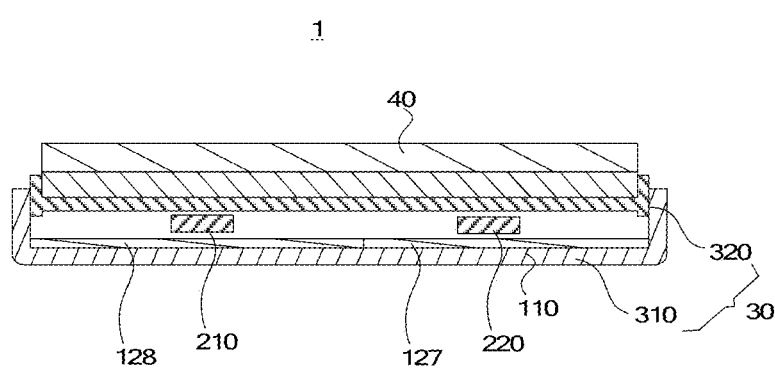
FIG. 47 is a schematic structural view of an electronic device according to the eighth implementation of the present disclosure.

FIG. 47 is a schematic structural view of the electronic device 1 according to the eighth implementation of the present disclosure. The dielectric substrate 11 includes a battery cover 30 of the electronic device 1. The battery cover 30 of the electronic device 1 includes a rear plate 310 and a frame 320 bent and extending from a peripheral edge of the rear plate 310. The first antenna module 210 and the second antenna module 220 are disposed corresponding to the rear plate 310, that is, the rear plate 310 is at least partially within the first preset direction range and at least partially within the second preset direction range. The first antenna module 210 being disposed corresponding to the rear plate 310 means that the rear plate 310 is at least partially disposed within a range of the first antenna module 210, where within the range the first antenna module 210 transmits and receives signals. The second antenna module 220 being disposed corresponding to the rear plate 310 means that the rear plate 310 is at least partially disposed within a range of the second antenna module 220, where within the range the second antenna module 220 transmits and receives signals. Correspondingly, the first radio-wave transparent structure 127 and the second radio-wave transparent structure 128 are disposed corresponding to the rear plate 310.

Figure 48:
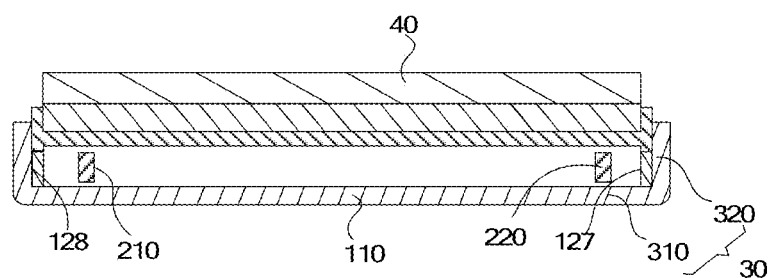
FIG. 48 is a schematic structural view of an electronic device according to the ninth implementation of the present disclosure.

FIG. 48 is a schematic structural view of the electronic device 1 according to a ninth implementation of the present disclosure. The electronic device 1 provided in the ninth implementation is substantially the same as the electronic device 1 provided in the eighth implementation of the present disclosure, except that the first antenna module 210 and the second antenna module 220 in the ninth implementation are both disposed corresponding to the frame 320, that is, the frame 320 is at least partially within the first preset direction range and at least partially within the second preset direction range. The first antenna module 210 being disposed corresponding to the frame 320 means that the frame 320 is at least partially disposed within a range of the first antenna module 210, where within the range the first antenna module 210 transmits and receives signals. The second antenna module 220 being disposed corresponding to the frame 320 means that the frame 320 is at least partially disposed within a range of the second antenna module 220, where within the range the second antenna module 220 transmits and receives signals. Accordingly, the first radio-wave transparent structure 127 and the second radio-wave transparent structure 128 are both disposed corresponding to the frame 320. As illustrated in FIG. 48, an example that the first radio-wave transparent structure 127 and the second radio-wave transparent structure 128 are respectively disposed corresponding to two opposite parts of the frame 320 of the electronic device 1 is taken for illustration.

Figure 49:
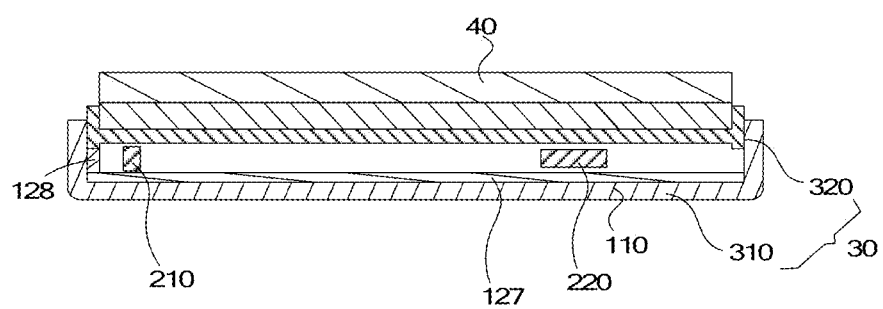
FIG. 49 is a schematic structural view of an electronic device according to the tenth implementation of the present disclosure.

FIG. 49 is a schematic structural view of the electronic device 1 according to a tenth implementation of the present disclosure. The electronic device 1 provided in the tenth implementation is substantially the same as the electronic device 1 provided in the eighth implementation of the present disclosure, except that the first antenna module 210 in the tenth implementation is disposed corresponding to the rear plate 310 and the second antenna module 220 in the tenth implementation is disposed corresponding to the frame 320, that is, the rear plate 310 is at least partially within the first preset direction range and the frame 320 is at least partially within the second preset direction range. The first antenna module 210 being disposed corresponding to the rear plate 310 means that the rear plate 310 is at least partially disposed within a range of the first antenna module 210, where within the range the first antenna module 210 transmits and receives signals. The second antenna module 220 being disposed corresponding to the frame 320 means that the frame 320 is at least partially disposed within a range of the second antenna module 220, where within the range the second antenna module 220 transmits and receives signals. Accordingly, the first radio-wave transparent structure 127 is disposed corresponding to the rear plate 310, and the second radio-wave transparent structure 128 is disposed corresponding to the frame 320. In another implementation, the first antenna module 210 in this implementation is disposed corresponding to the frame 320 and the second antenna module 220 in this implementation is disposed corresponding to the rear plate 310, that is, the frame 320 is at least partially within the first preset direction range and the rear plate 310 is at least partially within the second preset direction range.

Figure 50:
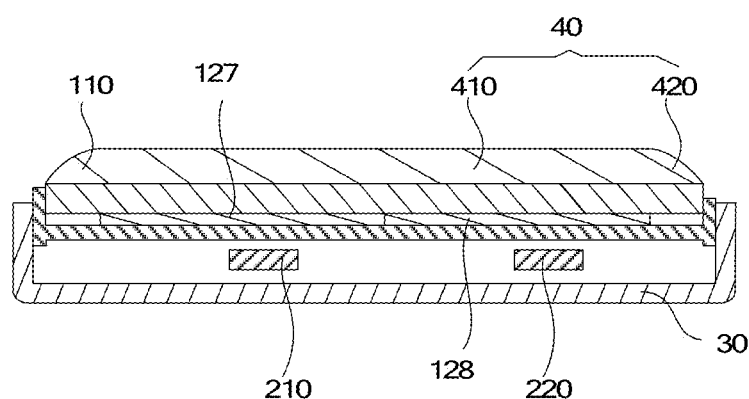
FIG. 50 is a schematic structural view of an electronic device according to the eleventh implementation of the present disclosure.

FIG. 50 is a schematic structural view of an electronic device 1 according to an eleventh implementation of the present disclosure. In this implementation, the dielectric substrate 110 includes the screen 40 of the electronic device 1. The screen 40 includes the screen body 410 and the extending portion 420 bent and extending from a peripheral edge of the screen body 410. The first antenna module 210 and the second antenna module 220 are both disposed corresponding to the screen body 410, the screen body 410 is at least partially within the first preset direction range and at least partially within the second preset direction range. Accordingly, the first radio-wave transparent structure 127 and the second radio-wave transparent structure 128 are both disposed corresponding to the screen body 410.

Figure 51:
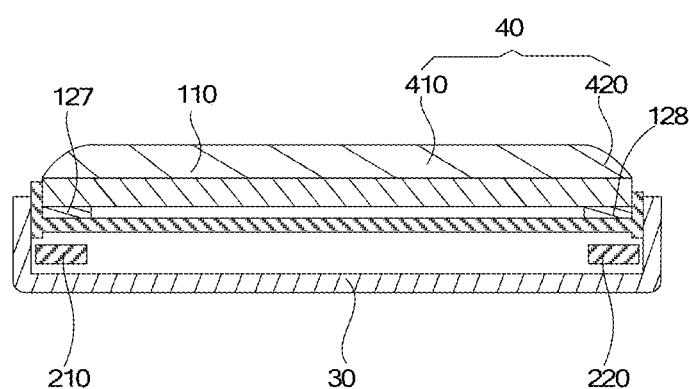
FIG. 51 is a schematic structural view of an electronic device according to the twelfth implementation of the present disclosure.

FIG. 51 is a schematic structural view of the electronic device 1 according to a twelfth implementation of the present disclosure. The first antenna module 210 and the second antenna module 220 are both disposed corresponding to the extending portion 420, that is, the extending portion 420 is at least partially within the first preset direction range and at least partially within the second preset direction range. Accordingly, the first radio-wave transparent structure 127 and the second radio-wave transparent structure 128 are both disposed corresponding to the extending portion 420.

Figure 52:
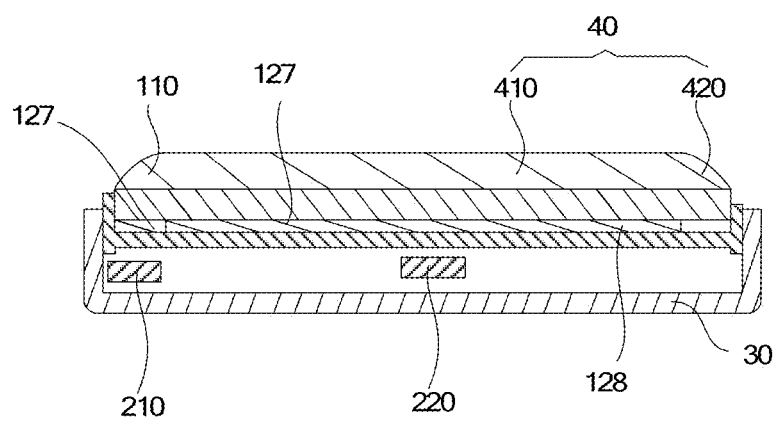
FIG. 52 is a schematic structural view of an electronic device according to the thirteenth implementation of the present disclosure.

FIG. 52 is a schematic structural view of the electronic device 1 according to a thirteenth implementation of the present disclosure. The first antenna module 210 is disposed corresponding to the screen body 410, and the second antenna module 220 is disposed corresponding to the extending portion 420, that is, the screen body 410 is at least partially within the first preset direction range and the extending portion 420 is at least partially within the second preset direction range. Accordingly, the first radio-wave transparent structure 127 is disposed corresponding to the screen body 410, and the second radio-wave transparent structure 128 is disposed corresponding to the extending portion 420.

Although the implementations of the present disclosure have been illustrated and described above, it can be understood that the above implementations are illustrative and cannot be understood as limitations on the present disclosure. Those skilled in the art can make changes, modifications, replacements, and variations for the above implementations within the scope of the present disclosure, and these improvements and modifications are also considered to fall into the protection scope of the present disclosure.

What is claimed is:

1. A housing assembly comprising:
    a dielectric substrate having a first transmittance for a radio frequency signal in a preset frequency band; and
    a radio-wave transparent structure disposed on the dielectric substrate and at least partially covering the dielectric substrate, a region of the housing assembly corresponding to the radio-wave transparent structure having a second transmittance for the radio frequency signal in the preset frequency band, wherein the second transmittance is larger than the first transmittance;
    wherein at least one of:
        the radio-wave transparent structure on the dielectric substrate is excited by the radio frequency signal in the preset frequency band, the radio-wave transparent structure generates a radio frequency signal in the same frequency band as the preset frequency band according to the radio frequency signal in the preset frequency band; or
        a dielectric constant of the housing assembly is equivalent to a dielectric constant of a preset material, an equivalent wave impedance of the preset material is equal to or approximately equal to an equivalent wave impedance of free space.

2. The housing assembly of claim 1, wherein the dielectric substrate comprises a first surface and a second surface opposite the first surface, and wherein
    the radio-wave transparent structure is disposed on the first surface; or
    the radio-wave transparent structure is disposed on the second surface; or
    the radio-wave transparent structure is embedded in the dielectric substrate.

3. The housing assembly of claim 1, wherein the radio-wave transparent structure is attached to a carrier film, wherein the carrier film is attached to the dielectric substrate.

4. The housing assembly of claim 1, wherein the radio-wave transparent structure comprises a plurality of radio-wave transparent layers stacked in a predetermined direction and spaced apart from each other.

5. The housing assembly of claim 1, wherein the dielectric substrate comprises a first surface and a second surface opposite the first surface, wherein a portion of the radio-wave transparent structure is disposed on the first surface, and the remaining portion of the radio-wave transparent structure is embedded in the dielectric substrate.

6. The housing assembly of claim 1, wherein the dielectric substrate is made of plastic, glass, sapphire or ceramic, or a combination of at least two of plastic, glass, sapphire, or ceramic.

7. The housing assembly of claim 1, wherein the radio-wave transparent structure comprises a plurality of resonance elements.

8. The housing assembly of claim 1, wherein
    the radio-wave transparent structure comprises a first radio-wave transparent layer, a second radio-wave transparent layer, and a third radio-wave transparent layer spaced apart from each other;
    the dielectric substrate comprises a first dielectric layer and a second dielectric layer, wherein the first radio-wave transparent layer, the first dielectric layer, the second radio-wave transparent layer, the second dielectric layer, and the third radio-wave transparent layer are sequentially stacked together; and
    the first radio-wave transparent layer comprises a plurality of first patches arranged in an array, the second radio-wave transparent layer comprises a plurality of mesh-grid structures arranged periodically, and the third radio-wave transparent layer comprises a plurality of second patches arranged in an array.

9. The housing assembly of claim 8, wherein
    the larger a size of each of the first patches or each of the second patches, the lower a center frequency of the preset frequency band and the narrower the preset frequency band; or
    the narrower each of the plurality of mesh-grid structures of the second radio-wave transparent layer, the lower the center frequency of the preset frequency band and the wider the preset frequency band; or
    the larger a period of the radio-wave transparent structure, the higher the center frequency of the preset frequency band and the wider the preset frequency band; or
    the thicker the radio-wave transparent structure, the lower the center frequency of the preset frequency band and the narrower the preset frequency band; or
    the larger a dielectric constant of the dielectric substrate, the lower the center frequency of the preset frequency band and the narrower the preset frequency band.

10. An electronic device comprising:
    an antenna module configured to transmit and receive, within a preset direction range, a radio frequency signal in a preset frequency band; and
    a housing assembly comprising:
        a dielectric substrate having a first transmittance for the radio frequency signal in the preset frequency band; and
        a radio-wave transparent structure disposed on the dielectric substrate and at least partially covering the dielectric substrate, wherein the radio-wave transparent structure is at least partially within the preset direction range;
    a region of the housing assembly within the preset direction range having a second transmittance for the radio frequency signal in the preset frequency band, wherein the second transmittance is larger than the first transmittance; and
    at least one of:
        the radio-wave transparent structure on the dielectric substrate is excited by the radio frequency signal in the preset frequency band, the radio-wave transparent structure generates a radio frequency signal in the same frequency band as the preset frequency band according to the radio frequency signal in the preset frequency band; or
        a dielectric constant of the housing assembly is equivalent to a dielectric constant of a preset material, an equivalent wave impedance of the preset material is equal to or approximately equal to an equivalent wave impedance of free space.

11. The electronic device of claim 10, wherein the dielectric substrate comprises a battery cover or a screen of the electronic device.

12. The electronic device of claim 10, wherein the dielectric substrate comprises a battery cover of the electronic device, wherein the battery cover comprises a rear plate and a frame bent and extending from a peripheral edge of the rear plate, and at least one of the rear plate or the frame is at least partially within the preset direction range.

13. The electronic device of claim 10, wherein the dielectric substrate comprises a screen of the electronic device, wherein the screen comprises a screen body and an extending portion bent and extending from a peripheral edge of the screen body, and wherein at least one of the screen body or the extending portion is at least partially within the preset direction range.

14. The electronic device of claim 10, wherein the electronic device comprises a battery cover and a protective cover, wherein the protective cover covers a surface of the battery cover to protect the battery cover, and the dielectric substrate comprises the protective cover.

15. The electronic device of claim 10, wherein the electronic device comprises a radio frequency antenna array with M×N antenna assemblies, wherein M is a positive integer and N is a positive integer.

16. The electronic device of claim 15, wherein the dielectric substrates of the M×N antenna assemblies are integrally connected with each other.

17. An electronic device comprising:
a first antenna module configured to transmit and receive, within a first preset direction range, a first radio frequency signal in a first frequency band;
a dielectric substrate spaced apart from the first antenna module, wherein at least part of the dielectric substrate is within the first preset direction range, and the at least part of the dielectric substrate has a first transmittance for the first radio frequency signal in the first frequency band; and
a first radio-wave transparent structure disposed on the dielectric substrate and at least partially within the first preset direction range, and a region of the electronic device within the preset direction range having a second transmittance for the first radio frequency signal in the first frequency band, wherein the second transmittance is larger than the first transmittance,
wherein at least one of:
the first radio-wave transparent structure on the dielectric substrate is excited by the first radio frequency signal in the first frequency band, the first radio-wave transparent structure generates a radio frequency signal in the same frequency band as the first frequency band according to the first radio frequency signal in the first frequency band; or
a dielectric constant of the electronic device within the preset direction range is equivalent to a dielectric constant of a preset material, an equivalent wave impedance of the preset material is equal to or approximately equal to an equivalent wave impedance of free space.

18. The electronic device of claim 17, further comprising:
a second antenna module spaced apart from the first antenna module, wherein the second antenna module is disposed outside the first preset direction range, and the second antenna module is configured to transmit and receive, within a second preset direction range, a second radio frequency signal in a second frequency band, and wherein the dielectric substrate is spaced apart from the second antenna module, and at least part of the dielectric substrate is within the second preset direction range, and the at least part of the dielectric substrate has a third transmittance for the second radio frequency signal in the second frequency band; and
a second radio-wave transparent structure disposed on the dielectric substrate and at least partially within the second preset direction range, and a region of the electronic device within the second preset direction range having a fourth transmittance for the second radio frequency signal in the second frequency band, wherein the fourth transmittance is larger than the third transmittance.

19. The electronic device of claim 18, wherein the dielectric substrate comprises a battery cover of the electronic device, wherein the battery cover comprises a rear plate and a frame bent and extending from a peripheral edge of the rear plate, and wherein
the rear plate is at least partially within the first preset direction range and at least partially within the second preset direction range; or
the frame is at least partially within the first preset direction range and at least partially within the second preset direction range; or
the rear plate is at least partially within the first preset direction range, and the frame is at least partially within the second preset direction range; or
the frame is at least partially within the first preset direction range, and the rear plate is at least partially within the second preset direction range.

20. The electronic device of claim 18, wherein the dielectric substrate comprises a screen of the electronic device, wherein the screen comprises a screen body and an extending portion bent and extending from a peripheral edge of the screen body, and wherein
the screen body is at least partially within the first preset direction range and at least partially within the second preset direction range; or
the extending portion is at least partially within the first preset direction range and at least partially within the second preset direction range; or
the screen body is at least partially within the first preset direction range, and the extending portion is at least partially within the second preset direction range; or
the extending portion is at least partially within the first preset direction range, and the screen body is at least partially within the second preset direction range.

* * * * *